US011587919B2

(12) United States Patent
Yip et al.

(10) Patent No.: US 11,587,919 B2
(45) Date of Patent: Feb. 21, 2023

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventors: Aaron S. Yip, Los Gatos, CA (US); Kunal R. Parekh, Boise, ID (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 16/932,098

(22) Filed: Jul. 17, 2020

(65) Prior Publication Data

US 2022/0020736 A1    Jan. 20, 2022

(51) Int. Cl.
*H01L 25/065* (2006.01)
*H01L 25/18* (2023.01)
(Continued)

(52) U.S. Cl.
CPC .............. *H01L 25/18* (2013.01); *H01L 24/08* (2013.01); *H01L 24/80* (2013.01);
(Continued)

(58) Field of Classification Search
CPC ............. H01L 2924/1431; H01L 24/08; H01L 24/80; H01L 25/0657; H01L 2224/08145;
(Continued)

(56) References Cited

U.S. PATENT DOCUMENTS 6,400,604 B2    6/2002 Noda
7,206,228 B2    4/2007 Park
(Continued)

FOREIGN PATENT DOCUMENTS

KR    10-2012-0053232 A    5/2012
KR    10-2012-0064482 A    6/2012
(Continued)

OTHER PUBLICATIONS

International Search Report for Application No. PCT/US2021/038092, dated Oct. 7, 2021, 3 pages.
(Continued)

*Primary Examiner* — Thanh Y. Tran
(74) *Attorney, Agent, or Firm* — TraskBritt

(57) ABSTRACT

A microelectronic device comprises a first die comprising a memory array region comprising a stack structure comprising vertically alternating conductive structures and insulative structures, and vertically extending strings of memory cells within the stack structure. The first die further comprises first control logic region comprising a first control logic devices including at least a word line driver. The microelectronic device further comprise a second die attached to the first die, the second die comprising a second control logic region comprising second control logic devices including at least one page buffer device configured to effectuate a portion of control operations of the vertically extending string of memory cells. Related microelectronic devices, electronic systems, and methods are also described.

29 Claims, 10 Drawing Sheets

(51) Int. Cl.
  *H01L 23/00* (2006.01)
  *H01L 25/00* (2006.01)
(52) U.S. Cl.
  CPC .......... *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/14511* (2013.01)
(58) Field of Classification Search
  CPC . H01L 2224/80895; H01L 2224/80896; H01L 2225/06524; H01L 2924/14511; H01L 2225/06541; H01L 27/11573; H01L 27/11526; H01L 25/50; H01L 25/18; H01L 2224/00; H01L 2224/08; H01L 24/05; H01L 27/11556; H01L 27/11582
  See application file for complete search history.

(56) References Cited

U.S. PATENT DOCUMENTS

| | | | |
|---|---|---|---|
| 7,372,091 B2 | 5/2008 | Leslie | |
| 8,482,955 B2 | 7/2013 | Johnson | |
| 8,958,228 B2 | 2/2015 | Samachisa et al. | |
| 8,971,112 B2 | 3/2015 | Crippa et al. | |
| 9,530,790 B1 | 12/2016 | Lu et al. | |
| 9,653,519 B2 | 5/2017 | Zhou et al. | |
| 9,653,617 B2 | 5/2017 | Zhou et al. | |
| 2003/0113669 A1 | 6/2003 | Cheng et al. | |
| 2006/0076690 A1 | 4/2006 | Khandros et al. | |
| 2008/0112221 A1 | 5/2008 | Park et al. | |
| 2009/0168482 A1 | 7/2009 | Park et al. | |
| 2009/0268537 A1 | 10/2009 | Kajigaya | |
| 2016/0104715 A1 | 4/2016 | Pachamuthu et al. | |
| 2016/0343727 A1 | 11/2016 | Kim et al. | |
| 2018/0364908 A1 | 12/2018 | Lea et al. | |
| 2019/0043836 A1 | 2/2019 | Fastow et al. | |
| 2019/0043868 A1 | 2/2019 | Hasnat et al. | |
| 2019/0043879 A1 | 2/2019 | Lu et al. | |
| 2021/0217730 A1* | 7/2021 | Parekh | H01L 24/05 |

FOREIGN PATENT DOCUMENTS

| | | |
|---|---|---|
| TW | 201209842 A | 3/2012 |
| TW | 201322415 A | 6/2013 |
| WO | 2008/063251 A2 | 5/2008 |

OTHER PUBLICATIONS

Written Opinion of the International Searching Authority for Application No. PCT/US2021/038092, dated Oct. 7, 2021, 4 pages.

Choe, Jeongdong, YMTC is Shina's First Mass Producer of 3D NAND Flash Memory Chips, https://www.techinsights.com/blog/ymtc-chinas-first-mass-producer-3d-nand-flash-memory-chips, (Mar. 12, 2020), 2 pages.

Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.

YMTC, Xtacking Enables DRAM-Lice High I/O Speed, http://www.ymtc.com/index.php?s=/cms/cate/69.html, visited Apr. 20, 2020, 3 pages.

Taiwanese Search Report and Office Action from Taiwanese Application No. 110124280, dated Mar. 23, 2022, 22 pages with English translation.

Taiwanese Second Office Action from Taiwanese Application No. 110124280, dated Aug. 8, 2022, 5 pages with English translation.

\* cited by examiner

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1B:
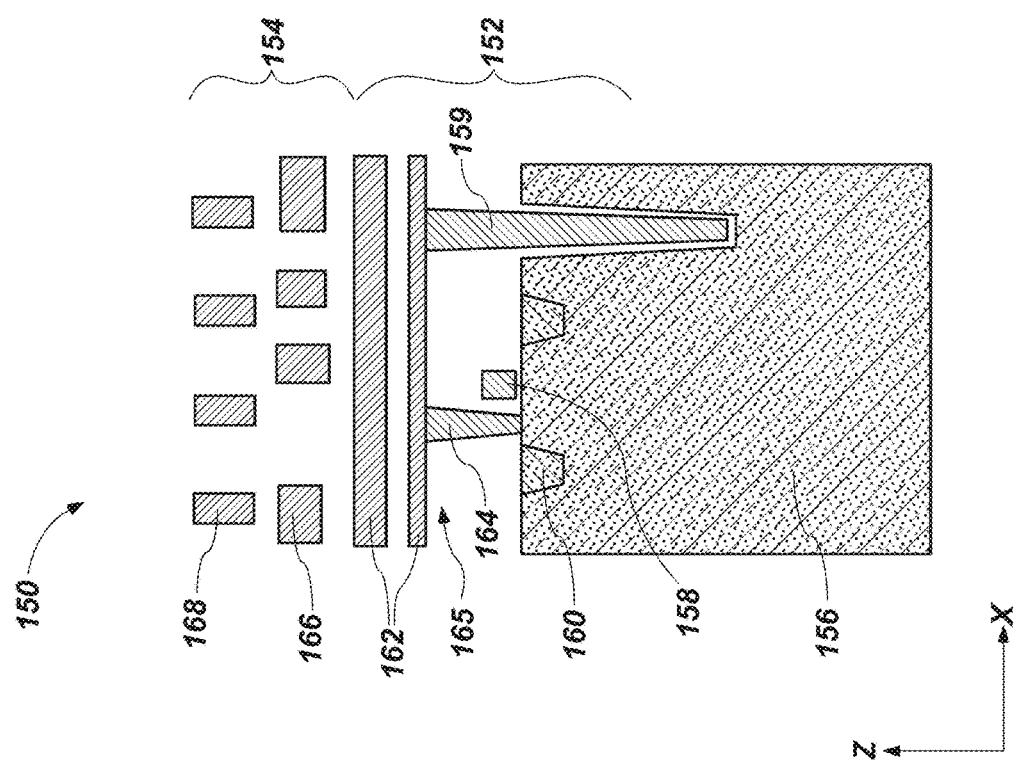
FIG. 1A through FIG. 1E are simplified, partial cross-sectional views illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND Flash memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include, for example, an array wafer comprising a memory array region and associated circuitry and the second microelectronic device structure may comprise, for example, a CMOS wafer comprising various control logic devices and structures. The first microelectronic device structure and the second microelectronic device structure may be formed separately, facilitating fabrication of transistors of devices (e.g., logic devices) and circuits thereof at different processing conditions (e.g., temperature) suitable for the available thermal budget for the respective one of the first microelectronic device structure and the second microelectronic device structure. Since the second microelectronic device structure is formed separately from the first microelectronic device structure, the second microelectronic device structure may not be subjected to the same thermal budget and processing conditions as the first microelectronic device structure. The second microelectronic device structure may be formed to include transistors comprising low voltage, high performance transistors while the first microelectronic device structure may include control logic devices configured to operate at applied voltages relatively higher than the applied voltages of the control logic devices of the second microelectronic device structure. In addition, a back end of the line (BEOL) structure comprising, for example, copper interconnections and aluminum metallization structures, may be formed on the back side of the second microelectronic device structure in a low thermal budget process, facilitating the inclusion of the low voltage, high performance transistors in the second microelectronic device structure.

In some embodiments, the first microelectronic device structure comprises logic devices that are different from logic devices of the second microelectronic device structure. For example, the first microelectronic device structure may include one or more high voltage devices, such as one or more of driver(s) (e.g., word line driver(s), block switch(es), and voltage pump(s)). The second microelectronic device structure may include one or more of low voltage devices, such as one or more of sense amplifier(s), page buffer(s), data path, I/O device(s), and controller logic. Providing some logic devices of the microelectronic device on the first microelectronic device structure and other logic devices of the microelectronic device on the second microelectronic device structure facilitates formation of a microelectronic device having a greater memory density than conventional microelectronic devices. Therefore, the first microelectronic device structure and the second microelectronic device structure may each comprise relatively smaller die sizes that conventional microelectronic devices. In addition, in some embodiments, the microelectronic device may include an assembly including more than one of the second microelectronic device structures. In some such embodiments, the microelectronic device may exhibit a greater amount of parallelism compared to conventional microelectronic devices since each of the second microelectronic device structures may include logic devices and circuitry that parallels logic devices and circuitry of the second microelectronic device structure (e.g., page buffers).

FIG. 1A through FIG. 1E are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein with reference to FIG. 1A through FIG. 1E may be used in various devices and electronic systems.

Figure 1A:
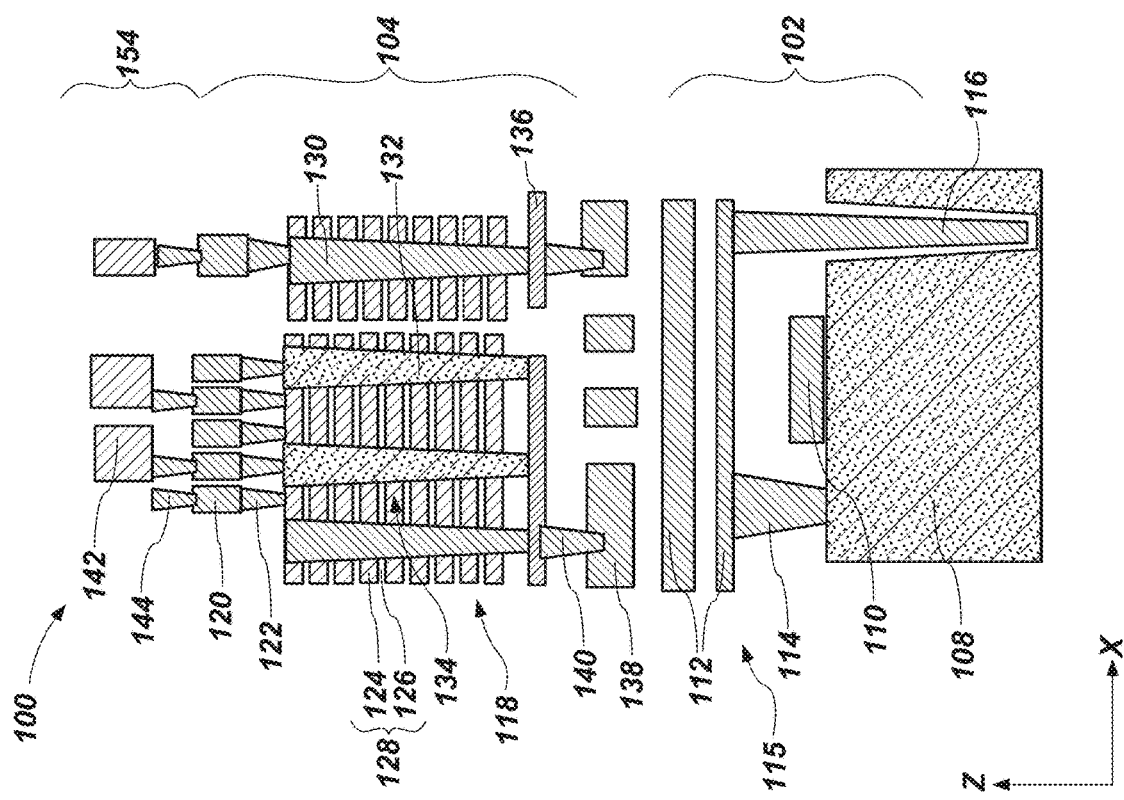

Referring to FIG. 1A, a first microelectronic device structure 100 (e.g., a first die) may be formed to include first control logic region 102, a memory array region 104 vertically over (e.g., in the Z-direction) and in electrical communication with the first control logic region 102, and an first interconnect region 106 vertically over and in electrical communication with the memory array region 104. Put another way, the memory array region 104 may be vertically interposed between and in electrical communication with the first control logic region 102 and the first interconnect region 106. The first control logic region 102 and the first interconnect region 106 may be at least partially (e.g., substantially) horizontally positioned (e.g., in the X-direction and another horizontal direction orthogonal to the X-direction) within horizontal boundaries of the memory array region 104 of the first microelectronic device structure 100.

The first control logic region 102 of the first microelectronic device structure 100 includes a first semiconductive base structure 108, first gate structures 110, first routing structures 112, and first interconnect structures 114. Portions of the first semiconductive base structure 108, the first gate structures 110, the first routing structures 112, and the first interconnect structures 114 form various first control logic devices 115 of the first control logic region 102, as described in further detail below.

The first semiconductive base structure 108 (e.g., first semiconductive wafer) of the first control logic region 102 comprises a base material or construction upon which additional materials and structures of the first microelectronic device structure 100 are formed. The first semiconductive base structure 108 may comprise a semiconductive structure (e.g., a semiconductive wafer), or a base semiconductive material on a supporting structure. For example, the first semiconductive base structure 108 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first semiconductive base structure 108 comprises a silicon wafer. In addition, the first semiconductive base structure 108 may include different layers, structures, and/or regions formed therein and/or thereon. For example, the first semiconductive base structure 108 may include conductively doped regions and undoped regions. The conductively doped regions may, for example, be employed as source regions and drain regions for transistors of the first control logic devices 115 of the first control logic region 102; and the undoped regions may, for example, be employed as channel regions for the transistors of the first control logic devices 115.

As shown in FIG. 1A, the first semiconductive base structure 108 may, optionally, further include one or more filled vias 116 (e.g., filled through-silicon vias (TSVs)) at least partially (e.g., less than completely, completely) vertically extending therethrough. If present, the filled via(s) 116 may be at least partially (e.g., substantially) filled with conductive material. The filled via(s) 116 may be employed to facilitate electrical connection between one or more components of the first microelectronic device structure 100 at a first side (e.g., a front side, a top side) of the first semiconductive base structure 108 and additional components (e.g., one or more structures and/or devices) to be provided at a second, opposing side (e.g., a back side, a bottom side) of the first semiconductive base structure 108, as described in further detail below. In additional embodiments, the filled via(s) 116 are omitted (e.g., absent) from the first semiconductive base structure 108.

With continued reference to FIG. 1A, the first gate structures 110 of the first control logic region 102 of the first microelectronic device structure 100 may vertically overlie portions of the first semiconductive base structure 108. The first gate structures 110 may individually horizontally extend between and be employed by transistors of the first control logic devices 115 within the first control logic region 102 of the first microelectronic device structure 100. The first gate structures 110 may be formed of and include conductive material. A gate dielectric material (e.g., a dielectric oxide) may vertically intervene (e.g., in the Z-direction) between the first gate structures 110 and channel regions (e.g., within the first semiconductive base structure 108) of the transistors.

As shown in FIG. 1A, the first routing structures 112 may vertically overlie (e.g., in the Z-direction) the first semiconductive base structure 108. The first routing structures 112 may be electrically connected to the first semiconductive base structure 108 by way of the first interconnect structures 114. Some of the first interconnect structures 114 may vertically extend between and electrically couple some of the first routing structures 112 to each other, and others of the first interconnect structures 114 may vertically extend between and electrically couple regions (e.g., conductively doped regions, such as source regions and drain regions) of the first semiconductive base structure 108 to one or more of the first routing structures 112. The first routing structures 112 and the first interconnect structures 114 may each individually be formed of and include conductive material.

As previously mentioned, portions of the first semiconductive base structure 108 (e.g., conductively doped regions serving as source regions and drain regions, undoped regions serving as channel regions), the first gate structures 110, the first routing structures 112, and the first interconnect structures 114 form various first control logic devices 115 of the first control logic region 102. The first control logic devices 115 may be configured to control various operations of other components of the first microelectronic device structure 100, such as components within the memory array region 104 of the first microelectronic device structure 100. The first control logic devices 115 included in the first control logic region 102 may be selected relative to additional control logic devices (e.g., second control logic devices) included in one or more additional control logic regions to be included an assembly including the first microelectronic device structure 100 and one or more additional microelectronic device structures, as described in further detail below. Configurations of the first control logic devices 115 included in the first control logic region 102 may be different than configuration of additional control logic devices included in the additional control logic region(s). In some embodiments, the additional control logic devices included in the additional control logic region(s) comprise relatively high performance control logic devices employing relatively high performance control logic circuitry (e.g., relatively high performance complementary metal oxide semiconductor (CMOS) circuitry); and the first control logic devices 115 included in the first control logic region 102 employ relatively lower performance control logic circuitry (e.g., additional CMOS circuitry). The additional control logic devices within the additional control logic region(s) may, for example, be configured to operate at applied voltages less than or equal to (e.g., less than) about 1.4 volts (V), such as within a range of from about 0.7 V to about 1.4 V (e.g., from about 0.7 V to about 1.3 V, from about 0.7 V to about 1.2 V, from about 0.9 V to about 1.2 V, from about 0.95 V to about 1.15 V, or about 1.1 V); and first control logic devices 115 within the first control logic region 102 may be configured to operate at applied voltages above upper operational voltages of additional control logic devices within the additional control logic regions(s), such as at applied voltages greater than about 1.2 V (e.g., greater than or equal to about 1.3 V, greater than or equal to about 1.4 V). Stated another way, the first control logic device 115 may be configured to operate at applied voltages that are greater than the applied voltages at which the additional control logic devices within the additional control logic region(s) are configured to operate.

As a non-limiting example, the first control logic devices 115 included within the first control logic region 102 of the first microelectronic device structure 100 may include one or more (e.g., each) of voltage pumps (also referred to as charge pumps) (e.g., $V_{CCP}$ charge pumps, $V_{NEGWL}$ charge pumps, DVC2 charge pumps), block switches (e.g., configured and operated for selection of memory blocks of the memory array region 104), and drivers (e.g., word line (WL) drivers). In some embodiments, the first control logic devices 115 further include various control circuitry associated with the memory array region 104. For example, the first control logic devices 115 may include logic for controlling the regulation of voltage references when biasing particular memory blocks into a read or write state, or for generating row and column addresses. Once a read or write operation is initiated, the first control logic devices 115 may generate bias voltages for word lines and bit lines within the memory array region 104, as well as generate the appropriate memory block, row, and column addresses.

As yet another non-limiting example, the first control logic devices 115 included within the first control logic region 102 of the first microelectronic device structure 100 may include one or more (e.g., each) of voltage pumps (e.g., $V_{CCP}$ charge pumps, $V_{NEGWL}$ charge pumps, DVC2 charge pumps), delay-locked loop (DLL) circuitry (e.g., ring oscillators), drain supply voltage (Vat') regulators, string drivers, and various chip/deck control circuitry. As another non-limiting example, the first control logic devices 115 may include devices configured to control column operations for arrays (e.g., memory element array(s), access device array(s)) within the memory array region 104 of the first microelectronic device structure 100, such as one or more (e.g., each) of decoders (e.g., local deck decoders, column decoders), repair circuitry (e.g., column repair circuitry), memory test devices, array multiplexers (MUX), and error checking and correction (ECC) devices. As a further non-limiting example, the first control logic devices 115 may include devices configured to control row operations for arrays (e.g., memory element array(s), access device array(s)) within the memory array region 104 of the first microelectronic device structure 100, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices.

The memory array region 104 of the first microelectronic device structure 100 may include a stack structure 118, line structures 120 (e.g., digit line structures, bit line structures), and line contact structures 122. As shown in FIG. 1A, the line structures 120 may vertically overlie (e.g., in the Z-direction) the stack structure 118, and may be electrically connected to structures (e.g., pillar structures, such as cell pillar structures; filled vias, such as through vias filled with conductive material) within the stack structure 118 by way of the line contact structures 122. The line contact structures 122 may vertically extend between and electrically couple individual line structures 120 and individual structures within the stack structure 118. The line structures 120 and the line contact structures 122 may each individually be formed of and include conductive material.

The stack structure 118 of the memory array region 104 includes a vertically alternating (e.g., in the Z-direction) sequence of conductive structures 124 and insulative structures 126 arranged in tiers 128. Each of the tiers 128 of the stack structure 118 may include at least one of the conductive structures 124 vertically neighboring at least one of the insulative structures 126. In some embodiments, the conductive structures 124 are formed of and include tungsten (W) and the insulative structures 126 are formed of and include silicon dioxide ($SiO_2$). The conductive structures 124 and insulative structures 126 of the tiers 128 of the stack structure 118 may each individually be substantially planar, and may each individually exhibit a desired thickness.

As shown in FIG. 1A, at least one deep contact structure 130 may vertically extend through the stack structure 118. The deep contact structure(s) 130 may be configured and positioned to electrically connect one or more components of the first microelectronic device structure 100 vertically overlying the stack structure 118 with one or more components of the first microelectronic device structure 100 vertically underlying the stack structure 118. The deep contact structure(s) 130 may be formed of and include conductive material.

The memory array region 104 further includes additional structures and/or devices on, over, and/or within the stack structure 118. As a non-limiting example, the memory array region 104 includes cell pillar structures 132 vertically extending through the stack structure 118. The cell pillar structures 132 may each individually include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the cell pillar structures 132 and the conductive structures 124 of the tiers 128 of the stack structure 118 may define vertically extending strings of memory cells 134 coupled in series with one another within the memory array region 104 of the first microelectronic device structure 100. In some embodiments, the memory cells 134 formed at the intersections of the conductive structures 124 and the cell pillar structures 132 within each the tiers 128 of the stack structure 118 comprise so-called "MONOS" (metal-oxide-nitride-oxide-semiconductor) memory cells. In additional embodiments, the memory cells 134 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 134 comprise so-called "floating gate" memory cells including floating gates (e.g., metallic floating gates) as charge storage structures. The floating gates may horizontally intervene between central structures of the cell pillar structures 132 and the conductive structures 124 of the different tiers 128 of the stack structure 118.

At least one source structure 136 may vertically underlie the tiers 128 of the conductive structures 124 and the insulative structure 126. In some embodiments, the cell pillar structures 132 are in electrical communication with the source structure 136. The source structure 136 may be formed of and include conductive material, such as one or more of doped silicon (e.g., doped polysilicon), tungsten silicide ($WSi_x$), tungsten nitride, and tungsten silicon nitride ($WSi_xN_y$). In some embodiments, the source structure 136 is formed of and includes doped silicon.

The cell pillar structures 132 may vertically extend from an upper vertical boundary of the stack structure 118, through the stack structure 118, and to a location at or proximate an upper vertical boundary of a source structure 136.

As shown in FIG. 1A, components of the memory array region 104 of the first microelectronic device structure 100 may be electrically connected to components (e.g., structures, such as the first routing structures 112; devices, such as the first control logic devices 115) of the first control logic region 102 of the first microelectronic device structure 100 by way of first pad structures 138 and second interconnect structures 140. For example, components (e.g., structures, devices) of the memory array region 104 may land on the first pad structures 138 by means of the second interconnect structures 140. Additional interconnect structures may vertically extend between and electrically connect the first pad structures 138 and various components of the first control logic region 102. The first pad structures 138 and the second interconnect structures 140 may each individually be formed of and include conductive material.

With continued reference to FIG. 1A, the first interconnect region 106 comprises first bond pad structures 142 electrically coupled to the line structures 120 by third interconnect structures 144 (only some of which are illustrated in FIG. 1A for clarity and ease of understanding the description). The third interconnect structures 144 may vertically overlie (e.g., in the Z-direction) and be electrically connected to the line structures 120 and the first bond pad structures 142 may vertically overlie (e.g., in the Z-direction) and be electrically connected to the third interconnect structures 144. The first bond pad structures 142 and the third interconnect structures 144 may individually be formed of and include conductive material. In some embodiments, the first bond pad structures 142 are formed of and include copper and the third interconnect structures 144 are formed of and include tungsten.

Referring next to FIG. 1B, a second microelectronic device structure 150 (e.g., a chiplet, a die) may be formed to include second control logic region 152, and a second interconnect region 154 vertically over and in electrical communication with the second control logic region 152. The second microelectronic device structure 150 may be configured to couple to the first microelectronic device structure 100 (e.g., such as to the line structures 120 via the first bond pad structures 142), as described in further detail below.

The second control logic region 152 of the second microelectronic device structure 150 may include a second semiconductive base structure 156, second gate structures 158, conductively doped regions 160 (e.g., source and drain regions), second routing structures 162, and fourth interconnect structures 164. Portions of the second semiconductive base structure 156, the second gate structures 158, conductively doped regions 160, the second routing structures 162, and the fourth interconnect structures 164 form various second control logic devices 165 of the second control logic region 152, as described in further detail below. The conductively doped regions 160 may be employed as source regions and drain regions for transistors of the second control logic devices 165 of the second control logic region 152. The second semiconductive base structure 156 may further include undoped regions, which may, for example, be employed as channel regions for the transistors of the second control logic devices 165.

The second semiconductive base structure 156 (e.g., second semiconductive wafer) of the second control logic region 152 comprises a base material or construction upon which additional materials and structures of the second microelectronic device structure 150 are formed. The second semiconductive base structure 156 may comprise a semiconductive structure (e.g., a semiconductive wafer), or a base semiconductive material on a supporting structure. For example, the second semiconductive base structure 156 may comprise a conventional silicon substrate (e.g., a conventional silicon wafer), or another bulk substrate comprising a semiconductive material. In some embodiments, the second semiconductive base structure 156 comprises a silicon wafer. In addition, the second semiconductive base structure 156 may include one or more layers, structures, and/or regions formed therein and/or thereon.

As shown in FIG. 1B, the second semiconductive base structure 156 may further include one or more additional filled via(s) 159 (e.g., additional filled TSVs) at least partially (e.g., less than completely, completely) vertically extending therethrough. The additional filled via(s) 159 may be at least partially (e.g., substantially) filled with conductive material. The additional filled via(s) 159 may be employed to facilitate electrical connection between one or more components of the second microelectronic device structure 150 at a first side (e.g., a front side, a top side) of the second semiconductive base structure 156 and additional components (e.g., one or more structures and/or devices) to be provided on a second, opposing side (e.g., a back side, a bottom side) of the second semiconductive base structure 156, as described in further detail below. In additional embodiments, the additional filled via(s) 159 are omitted (e.g., absent) from the second semiconductive base structure 156.

With continued reference to FIG. 1B, the second gate structures 158 of the second control logic region 152 of the second microelectronic device structure 150 may vertically overlie portions of the second semiconductive base structure 156. The second gate structures 158 may individually horizontally extend between and be employed by transistors of the second control logic devices 165 within the second control logic region 152 of the second microelectronic device structure 150. The second gate structures 158 may be formed of and include conductive material. A gate dielectric material (e.g., a dielectric oxide) may vertically intervene (e.g., in the Z-direction) between the second gate structures 158 and channel regions (e.g., within the second semiconductive base structure 156) of the transistors.

As shown in FIG. 1B, the second routing structures 162 may vertically overlie (e.g., in the Z-direction) the second semiconductive base structure 156. The second routing structures 162 may be electrically connected to the second semiconductive base structure 156 by way of the fourth interconnect structures 164. Some of the fourth interconnect structures 164 may vertically extend between and electrically couple some of the second routing structures 162 to each other, and other of the fourth interconnect structures 164 may vertically extend between and electrically couple regions (e.g., conductively doped regions 160, such as source regions and drain regions) of the second semiconductive base structure 156 to one or more of the second routing structures 162. The second routing structures 162 and the fourth interconnect structures 164 may each individually be formed of and include conductive material.

As previously mentioned, portions of the second semiconductive base structure 156 (e.g., conductively doped regions 160 serving as source regions and drain regions, undoped regions serving as channel regions), the second gate structures 158, the second routing structures 162, and the fourth interconnect structures 164 form various second control logic devices 165 of the second control logic region 152. The second control logic devices 165 may be configured to control various operations of other components of at least the first microelectronic device structure 100 (FIG. 1A), such as components within the memory array region 104 (FIG. 1A) of the first microelectronic device structure 100 (FIG. 1A). The second control logic devices 165 included in the second control logic region 152 may be selected relative to the first control logic devices 115 (FIG. 1A) included in at least the first control logic region 102 (FIG. 1A) of the first microelectronic device structure 100 (FIG. 1A). The second control logic devices 165 may be different than the first control logic devices 115 (FIG. 1A). In some embodiments, the second control logic devices 165 include relatively high performance control logic devices employing relatively high performance control logic circuitry (e.g., relatively high performance CMOS circuitry). The second control logic devices 165 may, for example, be configured to operate at applied voltages less than or equal to (e.g., less than) about 1.4 volts (V), such as within a range of from about 0.7 V to about 1.4 V (e.g., from about 0.9 V to about 1.2 V, from about 0.95 V to about 1.15 V, or about 1.1 V). In some embodiments, the second control logic devices 165 are configured to operate at applied voltages less than applied voltages at which the first control logic devices 115 are configured to operate. Accordingly, in some embodiments, transistors of the second control logic devices 165 may be configured to consume less power and may exhibit relatively improved short channel effects, low parasitic junction capacitance, and low junction leakage current (e.g., may comprise high-performance transistors) than transistors of the first control logic devices 115.

As a non-limiting example, the second control logic devices 165 included within the second control logic region 152 of the second microelectronic device structure 150 may include devices configured to control column operations for arrays (e.g., memory element array(s), access device array(s)) within the memory array region 104 (FIG. 1A) of the first microelectronic device structure 100 (FIG. 1A), such as one or more (e.g., each) of sense amplifiers (e.g., equalization (EQ) amplifiers, isolation (ISO) amplifiers, NMOS sense amplifiers (NSAs), PMOS sense amplifiers (PSAs)), page buffers, data paths, I/O devices (e.g., local I/O devices), and controller logic (e.g., timing circuitry, clock devices (e.g., a global clock device), deck enable, read/write circuitry (e.g., read enable circuitry, write enable circuitry), address circuitry (e.g., row decoder, column decoder), or other logic devices and circuitry). In some embodiments, the second control logic devices 165 do not include drivers (e.g., WL drivers), block switches, or charge or voltage pumps (e.g., $V_{CCP}$ charge pumps, $V_{NEGWL}$ charge pumps, DVC2 charge pumps), which devices may be located within the first control logic devices 115. In some embodiments, the second control logic devices 165 includes drivers (e.g., one or more column drivers), but does not include word line drivers.

As another non-limiting example, the second control logic devices 165 included within the second control logic region 152 of the second microelectronic device structure 150 may include devices configured to control column operations for arrays (e.g., memory element array(s), access device array(s)) within the memory array region 104 (FIG. 1A) of the first microelectronic device structure 100 (FIG. 1A), such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As another non-limiting example, the second control logic devices 165 may include devices configured to control row operations for arrays (e.g., memory element array(s), access device array(s)) within the memory array region 104 (FIG. 1A) of the first microelectronic device structure 100 (FIG. 1A), such as one or more (e.g., each) of decoders (e.g., local deck decoders, row decoders), drivers (e.g., column drivers), repair circuitry (e.g., row repair circuitry), memory test devices, MUX, ECC devices, and self-refresh/wear leveling devices.

With continued reference to FIG. 1B, the second interconnect region 154 of the second microelectronic device structure 150 may include second pad structures 166 and second bond pad structures 168. The second pad structures 166 may vertically overlie and be electrically connected to the second routing structures 162 of the second control logic region 152, and the second bond pad structures 168 may vertically overlie and be electrically connected to the second pad structures 166. For example, the second pad structures 166 may be electrically connected to the second bond pad structures 168 by means of interconnect structures and the second pad structures 166 may be electrically connected to the second routing structures 162 by means of additional interconnect structures. The second pad structures 166, the second bond pad structures 168, the interconnect structures, and the additional interconnect structures may each individually be formed of and include conductive material. In some embodiments, the second pad structures 166 and the second bond pad structures 168 are individually formed of and include copper.

Figure 1C:
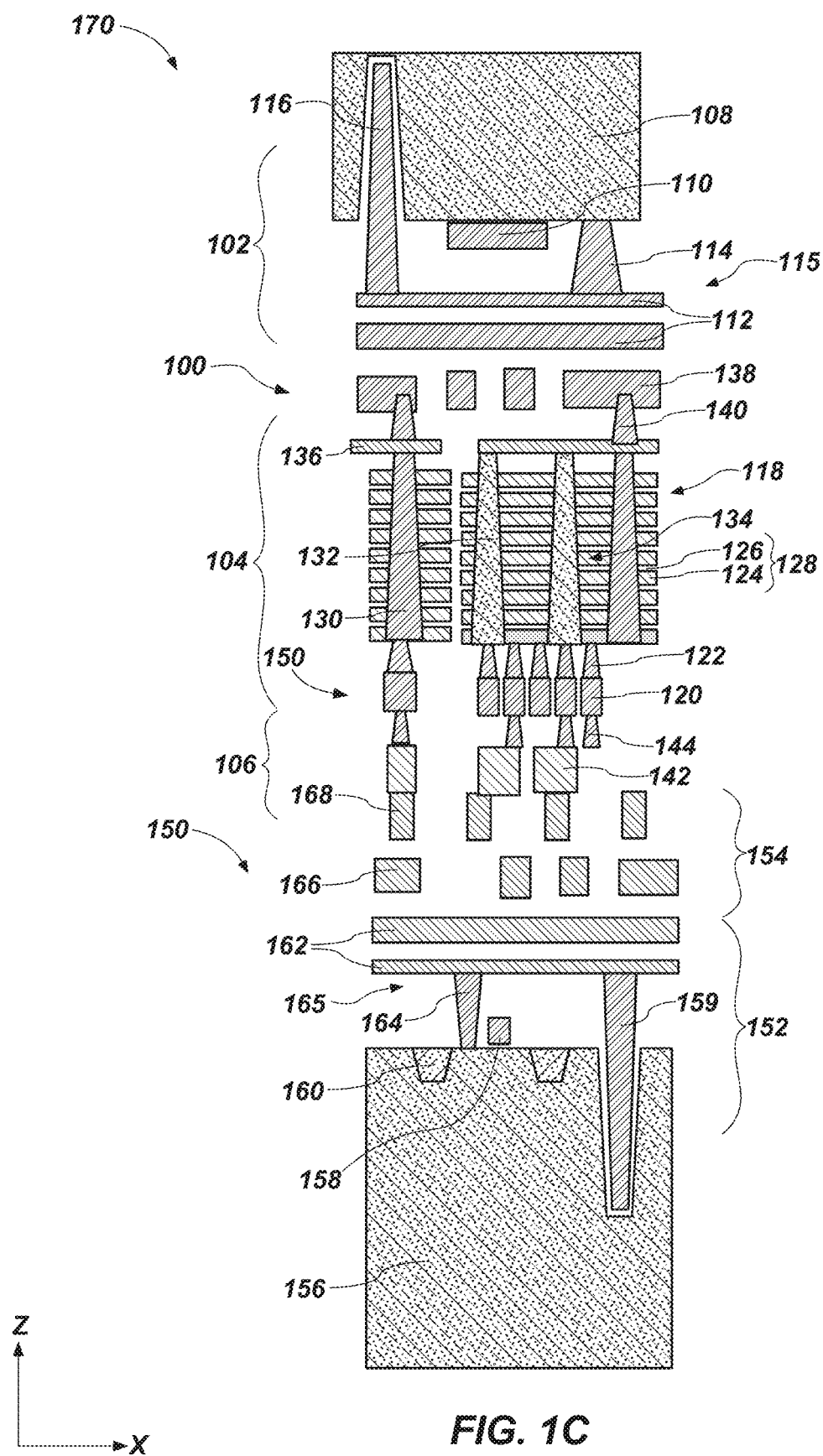

Referring now to FIG. 1C, the first microelectronic device structure 100 may be flipped upside down (e.g., in the Z-direction) and attached (e.g., bonded) to the second microelectronic device structure 150 to form a microelectronic device structure assembly 170 comprising the first microelectronic device structure 100 and the second microelectronic device structure 150. The first bond pad structures 142 of the first interconnect region 106 of the first microelectronic device structure 100 may be coupled to second bond pad structures 168 of the second interconnect region 154 of the second microelectronic device structure 150. For example, after flipping the first microelectronic device structure 100, the first bond pad structures 142 may be horizontally aligned and brought into physical contact with the second bond pad structures 168 of the second microelectronic device structure 150. At least one thermocompression process may be employed to migrate (e.g., diffuse) and interact material(s) (e.g., copper) of the first bond pad structures 142 and the second bond pad structures 168 with one another to bond the first microelectronic device structure 100 to the second microelectronic device structure 150 to form the microelectronic device structure assembly 170.

In some embodiments, the second control logic devices 165 of the second control logic region 152 may be operably coupled to the first microelectronic device structure 100 on a side of the first microelectronic device structure proximate the line structures 120 to couple the second control logic devices 165 to the memory array region 134 of the first microelectronic device structure 100.

Figure 1D:
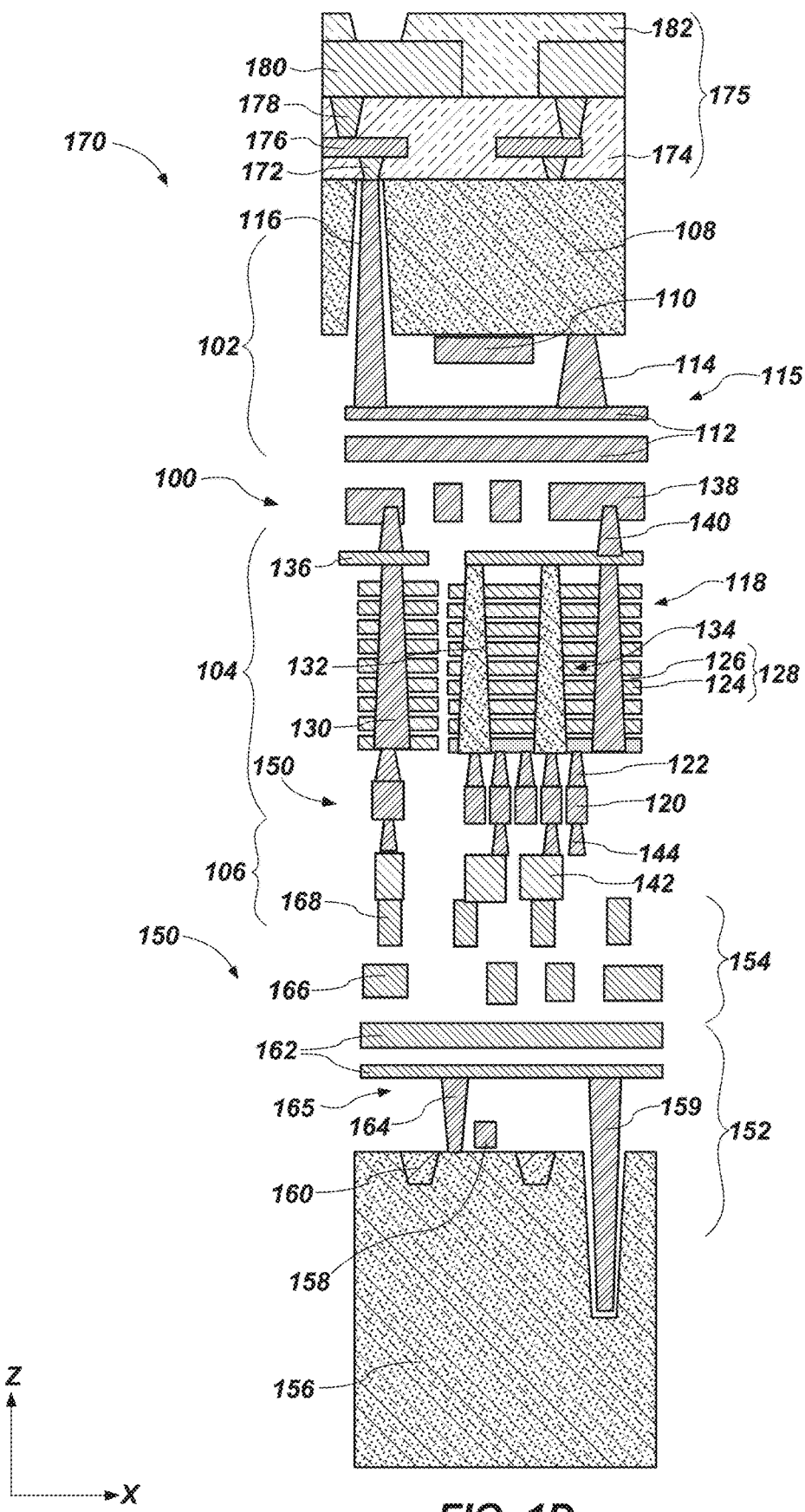

With reference now to FIG. 1D, after forming the microelectronic device structure assembly 170, portions of the first semiconductive base structure 108 on the back side of the first microelectronic device structure 100 may be removed (e.g., thinned) from the first microelectronic device structure 100. In some embodiments, removing the portions of the first semiconductive base structure 108 includes exposing a portion of the one or more filled vias 116 on the back side of the first semiconductive base structure 108. The portions of the first semiconductive base structure 108 may be removed by one or more material removal processes such as one or both of grinding and etching. For example, the portions of the first semiconductive base structure 108 may be removed by grinding. In some embodiments, portions of the first semiconductive base structure 108 are removed until a remaining thickness of the first semiconductive base structure 108 is less than about 100 µm, such as less than about 75 µm, less than about 50 µm, or less than about 40 µm.

With continued reference to FIG. 1D, after exposing the one or more filled vias 116, a back end of the line (BEOL) structure 175 may be formed over on the back side of the first semiconductive base structure 108 and in electrical communication with the one or more filled vias 116 or other conductive structures of the first semiconductive base structure 108. The BEOL structure 175 may include fifth interconnect structures 172 formed through a passivation material 174. The fifth interconnect structures 172 may be in electrical communication with the one or more filled vias 116 or other conductive structures within the first semiconductive base structure 108. The fifth interconnect structures 172 may be formed of and include conductive material, such as tungsten. The passivation material 174 may be formed of and include insulative material. Third bond pad structures 176 may vertically overlie and electrically connect to the fifth interconnect structures 172. The third bond pad structures 176 may be formed of and include conductive material. In some embodiments, the third bond pad structures 176 are formed of and include aluminum. In additional embodiments, the third bond pad structures 176 are formed of and include copper.

Sixth interconnect structures 178 may be formed in electrical communication with the third bond pad structures 176 and may vertically extend (e.g., in the Z-direction) between the third bond pad structures 176 and a metallization structure 180. The sixth interconnect structures 178 may be formed of and include conductive material, such as tungsten. In some embodiments, the sixth interconnect structures 178 are formed of and include tungsten. In some embodiments, the metallization structures 180 are formed of and include aluminum. A passivation material 182 may be formed over the microelectronic device structure assembly 170 to electrically isolate the metallization structures 180 from each other.

In some embodiments, the BEOL structure 175 is formed by a low thermal budget process (e.g., low thermal budget BEOL processing). Forming the BEOL structure 175 with low thermal budget processing may facilitate fabrication of high performance, low voltage transistors within the second microelectronic device structure 150 (e.g., within the second control logic region 152).

The microelectronic device structure assembly 170, including the second microelectronic device structure 150 thereof, facilitates improved microelectronic device performance, increased miniaturization of components, and greater packaging density as compared to conventional assembly configurations. For example, providing the second control logic region 152 vertically over the memory array region 104 may, for example, reduce the distance between the vertically extending strings of memory cells 134 of the memory array region 104 and the second control logic devices 165 (e.g., high performance I/O devices, high performance page buffers) of the microelectronic device structure assembly 170 relative to conventional configurations including such control logic devices within a conventional base control logic region vertically underlying the memory array region 104. For example, a distance between page buffers of the second control logic devices 165 and the vertically extending strings of memory cells 134 may be reduced relative to conventional configurations including such control logic devices within a conventional base control logic region vertically underlying the memory array region 104. In addition, employing the second control logic devices 165 within the second control logic region 152 instead of the first control logic region 102 may reduce horizontal dimensions of the first control logic region 102 relative to conventional base control logic region configurations, to facilitate relatively smaller horizontal footprints and improved memory array, die, and/or socket area efficiency as compared to conventional configurations.

Figure 1E:
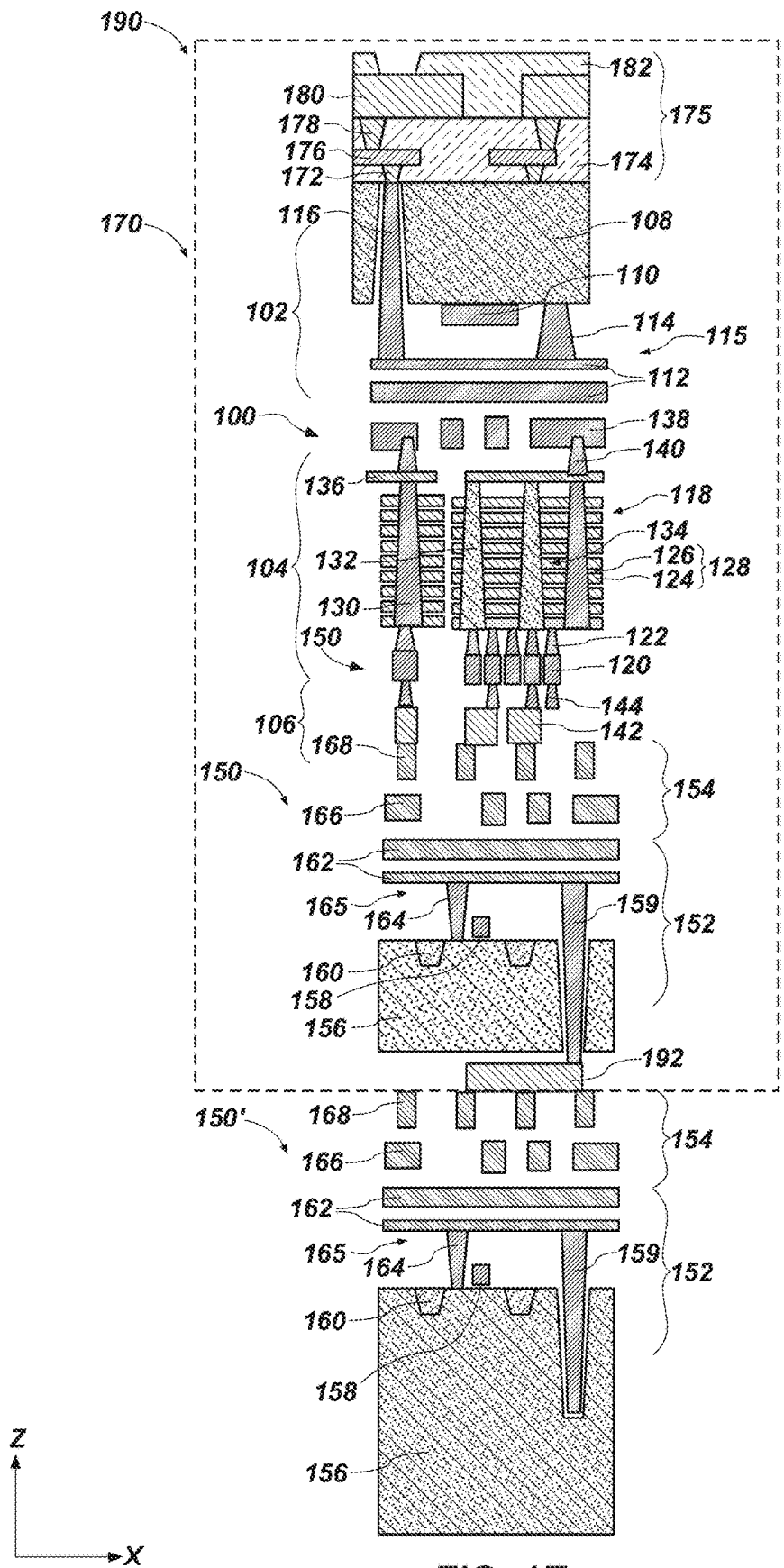

Referring to FIG. 1E, in some embodiments, after forming the BEOL structure 175, the microelectronic device structure assembly 170 may be subjected to additional processing. By way of non-limiting example, optionally, another microelectronic device structure 150' (e.g., an additional die) substantially similar to the second microelectronic device structure 150 may be attached to the second microelectronic device structure 150 of the microelectronic device structure assembly 170 to form a relatively larger microelectronic device structure assembly 190.

The relatively larger microelectronic device structure assembly 190 may, for example, be formed by thinning (e.g., in the Z-direction) the second semiconductive base structure 156 of the second microelectronic device structure 150 to expose the one or more additional filled via(s) 159; coupling (e.g., forming) fourth bond pad structures(s) 192 to the conductive material of the one or more additional filled via(s) 159; horizontally aligning and physically contacting the fourth bond pad structure(s) 192 with additional bond pad structures (e.g., the second bond pad structures 168 of the another microelectronic device structure 150'); and performing at least one thermocompression process to bond the fourth bond pad structure(s) 192 to the additional bond pad structures (e.g., the fourth bond pad structure(s) 192 of the second microelectronic device structure 150 to the second bond pad structures 168 of the another microelectronic device structure 150').

Although FIG. 1E has been described and illustrated as including two second microelectronic device structures (e.g., the second microelectronic device structure 150 and the another microelectronic device structure 150') comprising the second control logic devices 165, the disclosure is not so limited. Any desirably quantity of additional microelectronic device structures (e.g., second microelectronic device structures 150 including the second control logic devices 165) may be attached to the relatively larger microelectronic device structure assembly 190 by way of substantially similar processing.

As discussed above, the second control logic devices 165 may comprise low voltage and relatively high performance control logic devices employing relatively high performance control logic circuitry (e.g., relatively high performance complementary metal oxide semiconductor (CMOS) circuitry). In some embodiments, each of the second microelectronic device structure 150 and the additional microelectronic device structure 150' may include the same components and circuitry (e.g., logic devices and logic circuitry). By way of non-limiting example, in some embodiments, each of the second microelectronic device structure 150 and the additional microelectronic device structure 150' each individually include devices configured to control column operations for arrays (e.g., memory element array(s), access device array(s)) within the memory array region 104 (FIG. 1A) of the first microelectronic device structure 100 (FIG. 1A), such as one or more (e.g., each) of sense amplifiers (e.g., equalization (EQ) amplifiers, isolation (ISO) amplifiers, NMOS sense amplifiers (NSAs), PMOS sense amplifiers (PSAs)), page buffers, data paths, I/O devices (e.g., local I/O devices), and controller logic (e.g., timing circuitry, clock devices (e.g., a global clock device), deck enable, read/write circuitry (e.g., read enable circuitry, write enable circuitry), address circuitry (e.g., row decoder, column decoder), or other logic devices and circuitry). In some such embodiments, each of the second microelectronic device structure 150 and the additional microelectronic device structure 150' include one or more page buffers.

Forming the relatively larger microelectronic device structure assembly 190 to include more than one of the second microelectronic device structures 150 may facilitate formation of an assembly including an increased number of page buffers and an increased amount of parallelism (e.g., parallel computing (e.g., bit level parallel computing, instruction-level parallel computing, data parallel computing, task parallelism), memory-level parallelism). For example, because the larger microelectronic device structure assembly 190 includes segmented page buffers, the relatively larger microelectronic device structure assembly 190 may be configured to perform several operations in parallel due to the increased quantity of page buffers, without exhibiting an increase in the horizontal dimensions of the relatively larger microelectronic device structure assembly 190. Stated another way, multiple page buffers may be operably coupled to the first microelectronic device structure 100 (e.g., to the memory cells 134, to the line structures 120) in parallel.

Figure 2:
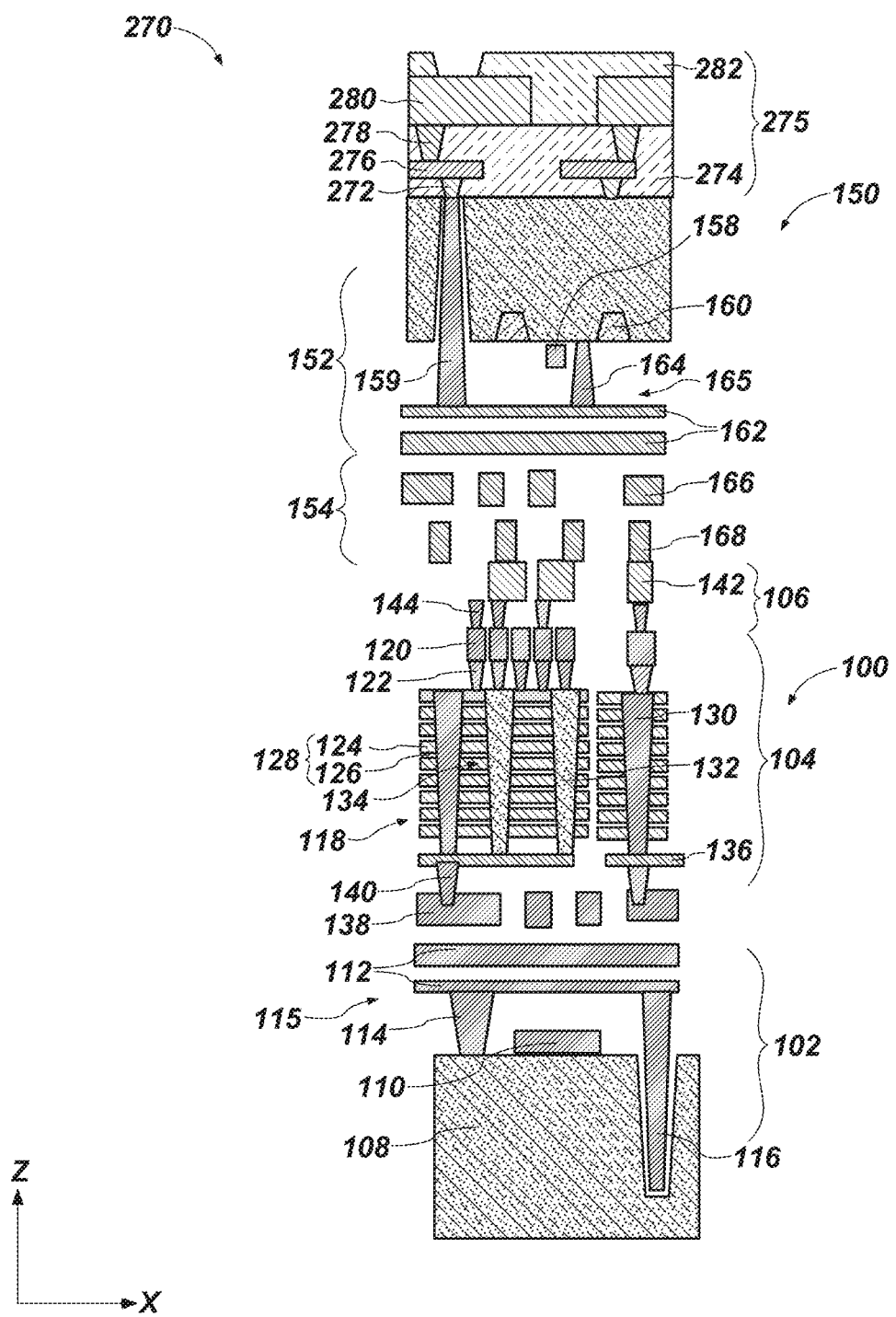
FIG. 2 is a simplified partial cross-sectional view of a microelectronic device structure assembly, in accordance with embodiments of the disclosure.

Although FIG. 1D and FIG. 1E have been described and illustrated as forming the back end of the line structure 175 on a back side of the first microelectronic device structure 100, the disclosure is not so limited. FIG. 2 is a simplified partial cross-sectional view of a microelectronic device structure assembly (e.g., an assembly including a memory device, such as a 3D NAND Flash memory device), in accordance with additional embodiments of the disclosure. With the description provided below, it will be readily apparent to one of ordinary skill in the art that the methods and structures described herein with reference to FIG. 2 may be used in various devices and electronic systems.

FIG. 2 is a simplified partial cross-sectional view of a microelectronic device structure assembly 270 that is substantially the same as the microelectronic device structure assembly 170 of FIG. 1C, except that the second semiconductive base structure 156 of the second microelectronic device structure 150 has been thinned and the microelectronic device structure assembly 270 includes a back end of the line (BEOL) structure 275 on a back side of the second microelectronic device structure 150 (e.g., on the thinned second semiconductive base structure 156), rather than on the back side of the first semiconductive base structure 108 of the first microelectronic device structure 100.

With reference to FIG. 1C and FIG. 2, portions of the second semiconductive base structure 156 on the back side of the second microelectronic device structure 150 may be removed (e.g., thinned) from the second microelectronic device structure 150 to expose a portion of the one or more filled via(s) 159 on the back side of the second semiconductive base structure 156. The second semiconductive base structure 156 may be thinned by one or more material removal processes such as one or both of grinding and etching. For example, the second semiconductive base structure 156 may be thinned by grinding. In some embodiments, the second semiconductive base structure 156 is removed until a remaining thickness of the second semiconductive base structure 156 is less than about 100 μm, such as less than about 75 μm, less than about 50 μm, or less than about 40 μm.

After exposing the one or more filled via(s) 159, the back end of the line structure 275 may be formed over on the back side of the second semiconductive base structure 156 and in electrical communication with the one or more filled via(s) 159 or other conductive structures of the first semiconductive base structure 108. The BEOL structure 275 may include interconnect structures 272 formed through a passivation material 274. The interconnect structures 272 may be in electrical communication with the one or more filled vias 116 or other conductive structures within the first semiconductive base structure 108. The interconnect structures 272 may be formed of and include conductive material, such as tungsten. The passivation material 274 may be formed of and include insulative material. Bond pad structures 276 may vertically overlie and electrically connect to the interconnect structures 272. The bond pad structures 276 may be formed of and include conductive material. In some embodiments, the bond pad structures 276 are formed of and include aluminum. In additional embodiments, the bond pad structures 276 are formed of and include copper.

Additional interconnect structures 278 may be formed in electrical communication with the bond pad structures 276 and may vertically extend (e.g., in the Z-direction) between the bond pad structures 276 and a metallization structure 280. The additional interconnect structures 278 may be formed of and include conductive material, such as tungsten. In some embodiments, the additional interconnect structures 278 are formed of and include tungsten. In some embodiments, the metallization structures 280 are formed of and include aluminum. A passivation material 282 may be formed over the microelectronic device structure assembly 270 to electrically isolate the metallization structures 280 from each other.

Figure 3A:
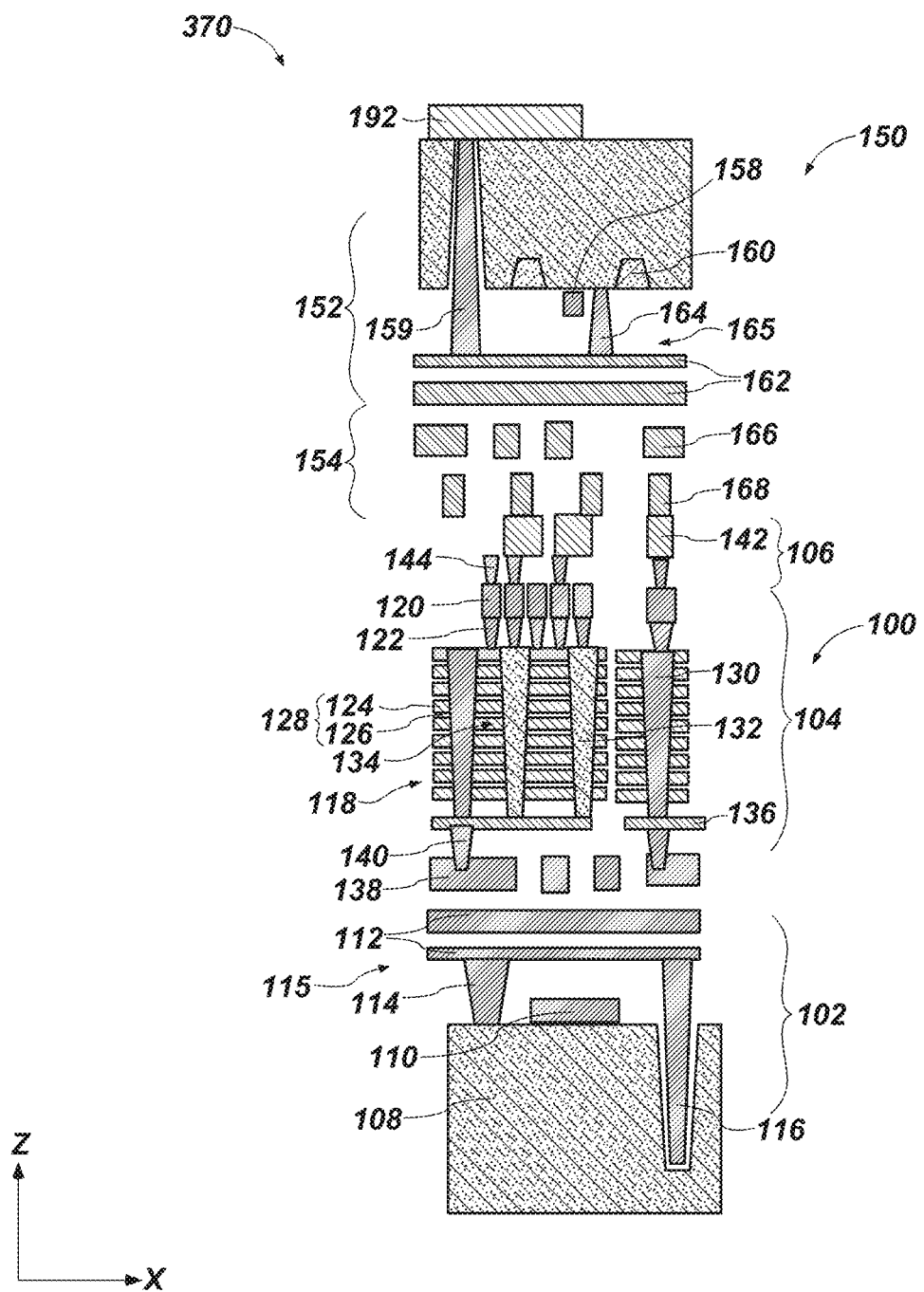
FIG. 3A and FIG. 3B are simplified, partial cross-sectional views illustrating a method of forming a microelectronic device, in accordance with additional embodiments of the disclosure.
Figure 3B:
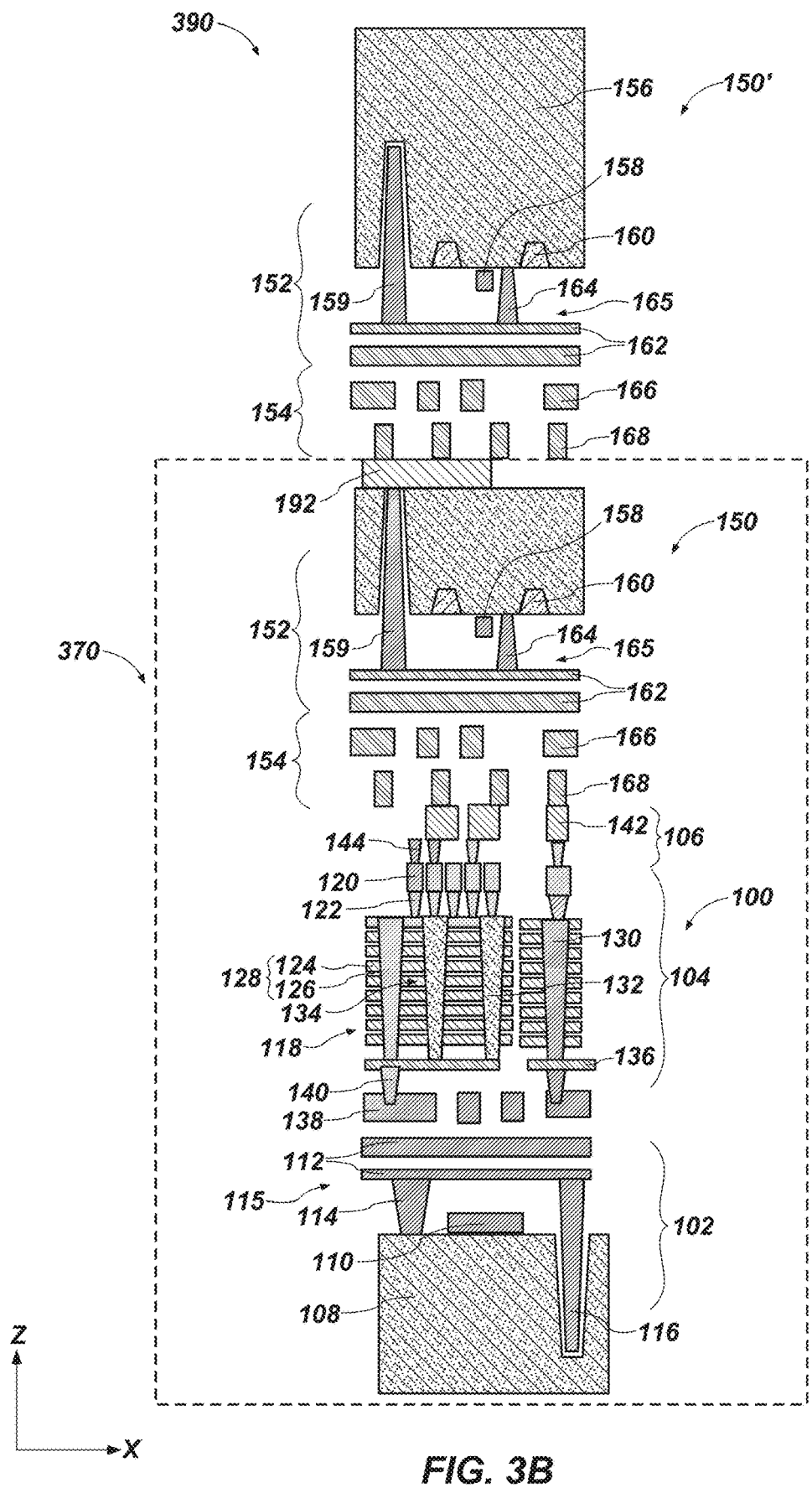

In yet other embodiments, the microelectronic device structure assembly 270 may include more than one of the second microelectronic device structures 150, as described above with reference to FIG. 1E. FIG. 3A and FIG. 3B are simplified partial cross-sectional views illustrating a method of forming a microelectronic device (e.g., a memory device, such as a 3D NAND Flash memory device), in accordance with embodiments of the disclosure. With the description provided below, it will be readily apparent to one of ordinary skill in the art that the methods and structures described herein with reference to FIG. 3A and FIG. 3B may be used in various devices and electronic systems.

Referring to FIG. 3A and FIG. 1C, the microelectronic device structure assembly 170 of FIG. 1C may be flipped (e.g., in the Z-direction) and portions of the second semiconductive base structure 156 may be thinned to expose the one or more additional via(s) 159 and form a microelectronic device structure assembly 370. The second semiconductive base structure 156 may be thinned by, for example, grinding, etching, or both.

After exposing the one or more additional via(s) 159, fourth bond pad structures(s) 192 may be formed in contact with the one or more additional via(s) 159. The fourth bond pad structures(s) 192 may be formed of and include conductive material. In some embodiments, the fourth bond pad structures(s) 192 are formed of and include copper.

Referring to FIG. 3B, the microelectronic device structure assembly 370 may be subjected to additional processing to form a relatively larger microelectronic device structure assembly 390. By way of non-limiting example, optionally, another microelectronic device structure 150' (e.g., an additional die) substantially similar to the second microelectronic device structure 150 may be attached to the microelectronic device structure assembly 370 to form the relatively larger microelectronic device structure assembly 390. The fourth bond pad structures(s) 192 of the microelectronic device structure assembly 370 may be horizontally aligned with and contacted by bond pad structures (e.g., the second bond pad structures 168) of the another microelectronic device structure 150' and at least one thermocompression process may be performed to bond the fourth bond pad structures(s) 192 of the microelectronic device structure assembly 370 to the bond pad structures (e.g., the second bond pad structures 168) of the another microelectronic device structure 150'.

After bonding the another microelectronic device structure 150' to the microelectronic device structure assembly 370, a back end of the line structure may be formed on the another microelectronic device structure 150', as described above with reference to formation of the back end of the line structure 275 of FIG. 2. For example, the second semiconductive base structure 156 of the another microelectronic device structure 150' may be thinned to expose the one or more additional via(s) 159 and the back end of the line structure 275 may be formed in electrical communication with the one or more additional via(s) 159, as described above with reference to FIG. 2.

Although FIG. 3B has been described and illustrated as including two second microelectronic device structures (e.g., the second microelectronic device structure 150 and the another microelectronic device structure 150') comprising the second control logic devices 165, the disclosure is not so limited. Any desirably quantity of additional microelectronic device structures (e.g., second microelectronic device structures 150 including the second control logic devices 165) may be attached to the relatively larger microelectronic device structure assembly 390 by way of substantially similar processing.

Forming the back end of the line structure 275 on a side of the second semiconductive base structure 156 of the second microelectronic device structure 150, 150', as described above with reference to FIG. 2 and FIG. 3B may facilitate improved communication between, for example, I/O devices that are located within the second microelectronic device structures 150, 150' and devices external to the microelectronic device structure assembly 270 or the relatively larger microelectronic device structure assembly 390.

As discussed above, the second control logic devices 165 may comprise low voltage and relatively high performance control logic devices employing relatively high performance control logic circuitry (e.g., relatively high performance complementary metal oxide semiconductor (CMOS) circuitry). In addition, the relatively larger microelectronic device structure assembly 390 including more than one of the microelectronic device structures 150 may facilitate formation of an assembly including an increased number of page buffers and an increased amount of parallelism (e.g., parallel computing (e.g., bit level parallel computing, instruction-level parallel computing, data parallel computing, task parallelism), memory-level parallelism) compared to conventional microelectronic devices.

Figure 4B:
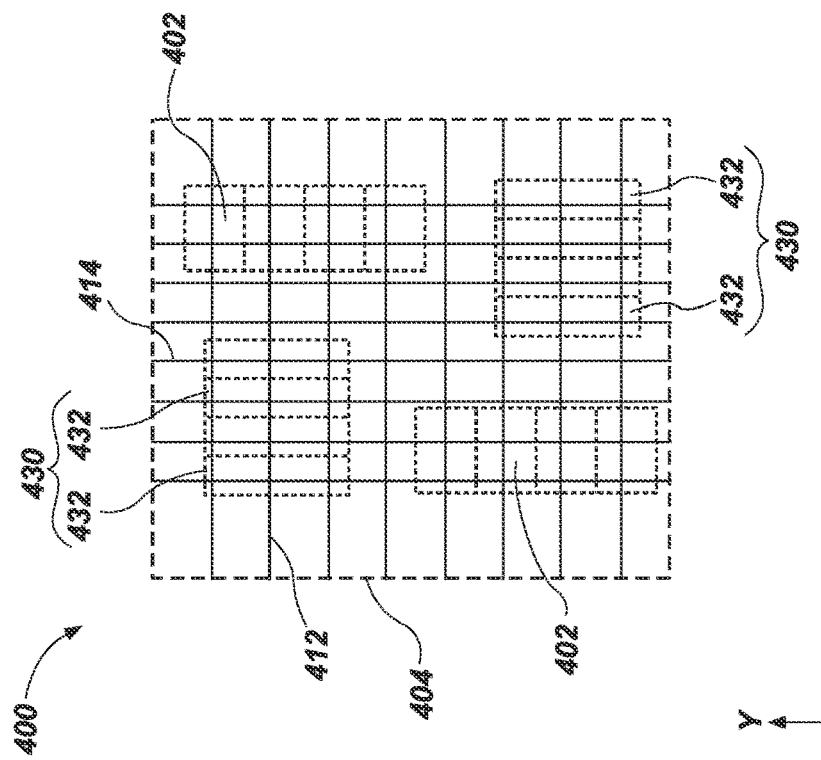
FIG. 4A and FIG. 4B are simplified schematics illustrating a circuit footprint of a microelectronic device including a first microelectronic device structure and a second microelectronic device structure, in accordance with embodiments of the disclosure.
Figure 4A:
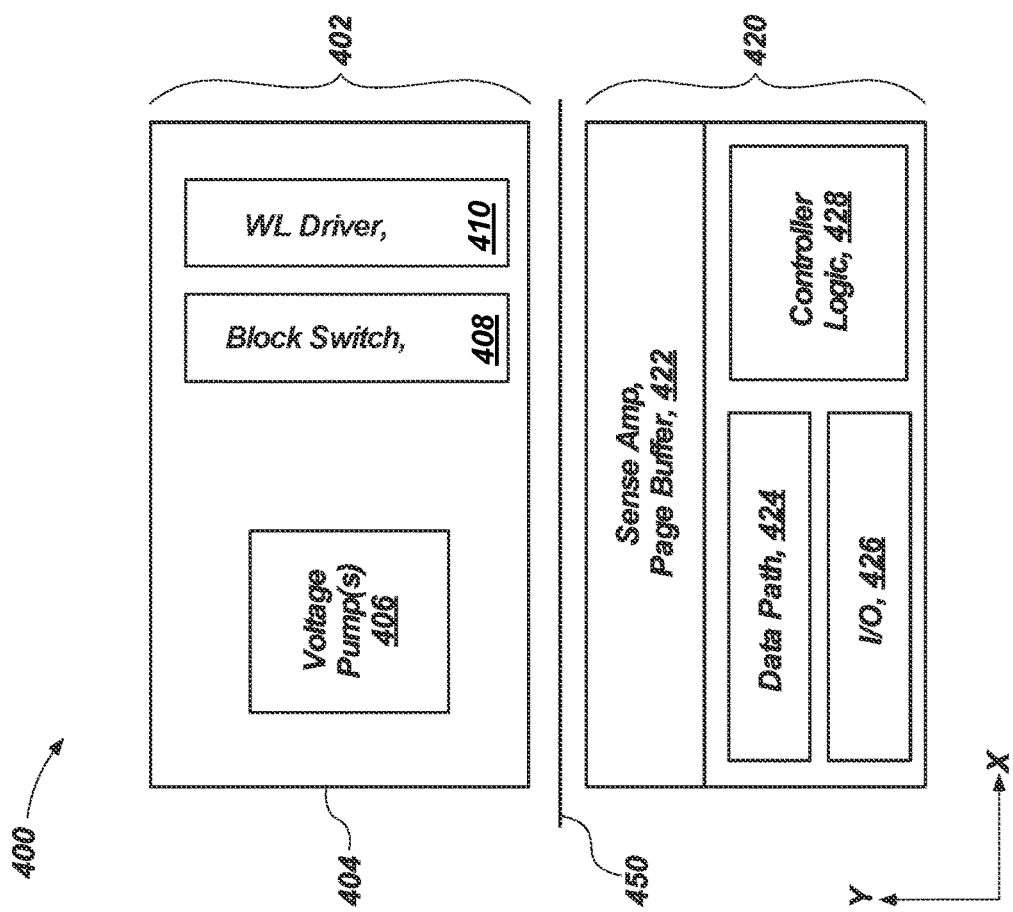

FIG. 4A is a simplified schematic illustrating a circuit footprint of a microelectronic device 400, in accordance with embodiments of the disclosure. The microelectronic device may include one of the microelectronic device structure assemblies 170, 270, 370 or the relatively larger microelectronic device structure assemblies 190, 390 described above with reference to FIG. 1A through FIG. 3B. FIG. 4A illustrates the circuit footprint of the microelectronic device 400 from a top view and illustrates the circuit footprint in the X-Y plane.

The microelectronic device 400 may include a first microelectronic device structure 402 that may be substantially similar to the first microelectronic device structure 100 described above with reference to FIG. 1A and at least a second microelectronic device structure 420 that may be substantially similar to the second microelectronic device structure 150 described above with reference to FIG. 1B. Although the first microelectronic device structure 402 and the second microelectronic device structure 420 are illustrated as being located in the same X-Y plane in FIG. 4A, it will be understood that the first microelectronic device structure 402 is vertically offset (e.g., in the Z-direction) from the second microelectronic device structure 420. Line 450 of FIG. 4A is to indicate that the first microelectronic device structure 402 is vertically offset from the second microelectronic device structure 420. Accordingly, in some embodiments, the first microelectronic device structure 402 may not be horizontally offset (e.g., in one or both of the X-direction and the Y-direction) from the second microelectronic device structure 420.

Each of the first microelectronic device structure 402 and the second microelectronic device structure 420 may individually comprise a die and may be coupled to each other, as described above with reference to FIG. 1A through FIG. 3B. As indicated in FIG. 4A, the first microelectronic device structure 402 die and the second microelectronic device structure 420 die may have the same size (e.g., area).

The first microelectronic device structure 402 may be defined by an array boundary 404, which may define a periphery of a memory array region (e.g., the memory array region 104 (FIG. 1A)). Accordingly, the array boundary 404 may define locations (e.g., an area) in which memory cells (e.g., memory cells 134 (FIG. 1A)) are located, such as strings of memory cells of cell pillar structures (e.g., cell pillar structures 132 (FIG. 1A)). In addition, in some embodiments, the array boundary 404 includes contact regions for forming contacts to the word lines (e.g., the conductive structures 124) of the stack structure 118.

The first microelectronic device structure 402 may include various logic devices and associated circuitry. In some embodiments, substantially all (e.g., all of) the logic devices of the first microelectronic device structure 402 may be located within an area defined by the array boundary 404. In some such embodiments, the first microelectronic device structure 402 may be referred to as a so-called "zero periphery" device structure.

In some embodiments, the logic devices of the first microelectronic device structure 402 vertically neighbor the memory array, as described above with reference to FIG. 1A and the first control logic device 115 of the first control logic region 102 underlying the memory array region 104. For example, the logic devices may be located under the memory array and within the boundaries defined by the array boundary 404.

With continued reference to FIG. 4A, and as only one example, the logic devices of the first microelectronic device structure 402 include voltage pumps 406 (e.g., $V_{CCP}$ charge pumps, $V_{NEGWL}$ charge pumps, DVC2 charge pumps), block switches 408, and drivers 410 (e.g., word line (WL) drivers). In some embodiments, the logic devices of the first microelectronic device structure 402 consist essentially of voltage pumps 406, block switches 408, and drivers 410. Other logic devices and circuitry of the microelectronic device 400 (e.g., high performance CMOS devices) may be located within the second microelectronic device structure 420, as will be described herein.

The block switch 408 may include circuitry and logic configured and operated to switch between blocks of memory cells (e.g., memory cells 134 (FIG. 1A)) of the memory array (e.g., blocks of memory cells 134 of the stack structure 118 (FIG. 1A) and associated cell pillar structures 132 (FIG. 1A)). The block switch 408 may be configured and operated to receive a block select signal (e.g., a block address signal) and to output a signal to turn on one or more transistors of a selected block and turn off one or more transistors of an unselected block. The block switch 408 may receive the block select signal from, for example, a read/write circuit, the controller logic 428, or another device.

The word line driver 410 may be in electrical communication with a row decoder and may be configured and operated to activate word lines of the memory array (e.g., word lines of the stack structure 118 (FIG. 1A) associated with memory cells 134 (FIG. 1A) of the cell pillar structures 132 (FIG. 1A)) based on word line selection commands received from the row decoder. The memory cells (e.g., the memory cells 134) may be accessed by access devices for reading or programming by voltages placed on the word lines using the word line driver 410.

Forming the first microelectronic device structure 402 to include the logic devices thereof within the array boundary 404 may facilitate a reduction in the size (e.g., footprint, area) of the microelectronic device 400.

The second microelectronic device structure 420 may include additional logic devices and circuitry for controlling various operations of the first microelectronic device structure 402 (e.g., various operations of the memory array region 104 (FIG. 1A)). The devices and circuitry of the second microelectronic device structure 420 may be selected based on (e.g., relative to) the devices and circuitry of the first microelectronic device structure 402. The devices and circuitry of the second microelectronic device structure 420 may be different than the devices and circuitry of the first microelectronic device structure 402.

By way of non-limiting example, the second microelectronic device structure 420 may include sense amplifier(s) and page buffer(s) 422, data path 424, I/O devices 426, and controller logic 428. In some embodiments, the area occupied by the devices of the second microelectronic device structure 420 (e.g., the sense amplifier(s) and page buffer(s) 422, the data path 424, the I/O devices 426, and the controller logic 428) may be substantially the same as the array defined by the array boundary 404. Stated another way, the devices of the second microelectronic device structure 420 may be located within an area that corresponds to the area occupied and defined by the array boundary 404. Accordingly, the second microelectronic device structure 420 die may be stacked to vertically neighbor the first microelectronic device structure 402 and may not occupy additional area relative to the first microelectronic device structure 402.

In some embodiments, the second microelectronic device structure 420 includes one or more row decoders.

The sense amplifier(s) of the sense amplifier(s) and page buffer(s) 422 may be configured to receive digit line inputs from the digit lines selected by a column decoder and to generate digital data values during read operations. Accordingly, the sense amplifier(s) may be configured and operated to sense (read) data from the memory cells (e.g., the memory cells 134 (FIG. 1A)) of the memory array (e.g., the memory array region 104 (FIG. 1A)). In some embodiments, the column decoder is located within the second microelectronic device structure 420.

The page buffer(s) of the sense amplifier(s) and page buffer(s) 422 may be configured to receive data from memory cells (e.g., memory cells 134 (FIG. 1A)) of strings of memory cells of a memory array region (e.g., the memory array region 104 (FIG. 1A)) and store the data (e.g., temporarily store the data) during various read and write operations. The page buffer(s) may be in operably communication with the data path 424 and the I/O devices 426 and may facilitate increased transfer of data between the I/O devices 426 and the strings of memory cells of the memory array. In some embodiments, the page buffer(s) 422 each individually comprise the same size (capacity) as that of a memory page in which data read from the memory cells of the memory page are temporarily stored before being serially output (e.g., to one or more I/O devices 426). In addition, the page buffer(s) 422 may be configured to store information that is to be written to memory page of the memory cells 134. Accordingly, the page buffer(s) 422 may include a relatively large number of volatile storage elements, typically bistable elements or latches, in a number corresponding to the number of memory cells of the memory page.

The data path 424 may be configured and operated to provide data to one or more devices (e.g., logic devices) of the microelectronic device 400. For example, the data path 424 may be configured and operated to move data values to and/or from the memory cells 134 (FIG. 1A) of the cell pillar structures 132 (FIG. 1A) to and/or from one or more devices (e.g., logic devices). The data path 424 may be associated with the memory array and with, for example, the I/O devices 426 (e.g., data input/output pads), page buffers 422, the controller logic 428, and other devices. For example, the data path 424 may be located between memory banks and corresponding data input/output terminals (DQ pads).

The I/O devices 426 may be configured and operated to program data into memory elements (e.g., memory cells 134 (FIG. 1A)) of the first microelectronic device structure 402 by placing proper voltages on the digit lines selected by the column decoder. In some embodiments, the I/O devices 426 may be used for bi-directional data communication with a host over a data bus and may be coupled to write circuitry configured for writing data to the memory array.

The controller logic 428 may be configured to control one or more operations of the first microelectronic device structure 402, including, for example, data sensing operations (e.g., read operations) and data programming operations (e.g., write operations). In some embodiments, the controller logic 428 is configured to sense changes in external signals and configured to issue internal signals based on, for example, whether the external signal(s) are a read operation, a write operation, or another signal. For example, the controller logic 428 may receive inputs comprising a chip select signal, a read/write signal (e.g., write enable signals, address latch signals), or another signal. Responsive to receiving a read/write signal, the controller logic 428 may send a signal (e.g., a read enable signal, a write enable signal) to, for example, a row decoder and/or a column decoder. The row decoder, as described above, may be configured to send an address signal to a word line driver (e.g., the word line driver 410) located within the first microelectronic device structure 402. The row decoder may be configured and operated to select particular word lines of the memory array based on the row address signal received thereby. The row decoder may output a word line section command to the word line driver 410. The column decoder may be configured and operated to select particular digit lines (e.g., bit lines) of the memory array based on the column address selection signal received thereby.

In some embodiments, the sense amplifier(s) and page buffer(s) 422 may extend a length (e.g., in the X-direction) of the second microelectronic device structure 420. In other words, the sense amplifier(s) and page buffer(s) 422 circuits may utilize the entire length of the second microelectronic device structure 420. Such a configuration may facilitate a higher density of memory array (e.g., the memory array region 104 (FIG. 1A)) structures in a given are due to the greater area for the supporting quantity of sense amplifier(s) and page buffer(s) 422.

FIG. 4B is a simplified schematic illustrating a layout of the microelectronic device 400. The components and circuitry of the microelectronic device are located within the array boundary 404. The memory array (e.g., the memory array region 104 (FIG. 1A)) may include, for example, word lines 412 extending in a first direction (e.g., in the X-direction) and digit lines 414 (e.g., bit lines) extending in a second direction (e.g., the Y-direction) that may be substantially perpendicular to the first direction. The word lines 412 may be coupled to drivers 410 (e.g., word line drivers). In some embodiments, the first microelectronic device structure 402 includes more than one (e.g., two) drivers 410.

The first microelectronic device structure 402 may further include one or more banks 430 of page buffers 432 that may be vertically offset from the drivers 410. The banks 430 of page buffers 432 may also be laterally offset (e.g., in one or both of the X-direction and the Y-direction) from the drivers 410. Stated another way, the banks 430 of page buffers 432 may not directly vertically neighbor the drivers 410. In some embodiments, neither of the drivers 410 nor the banks 430 of page buffers 432 may occupy more than about 50% of the area within the array boundary 404.

Figures 5A, 5B:
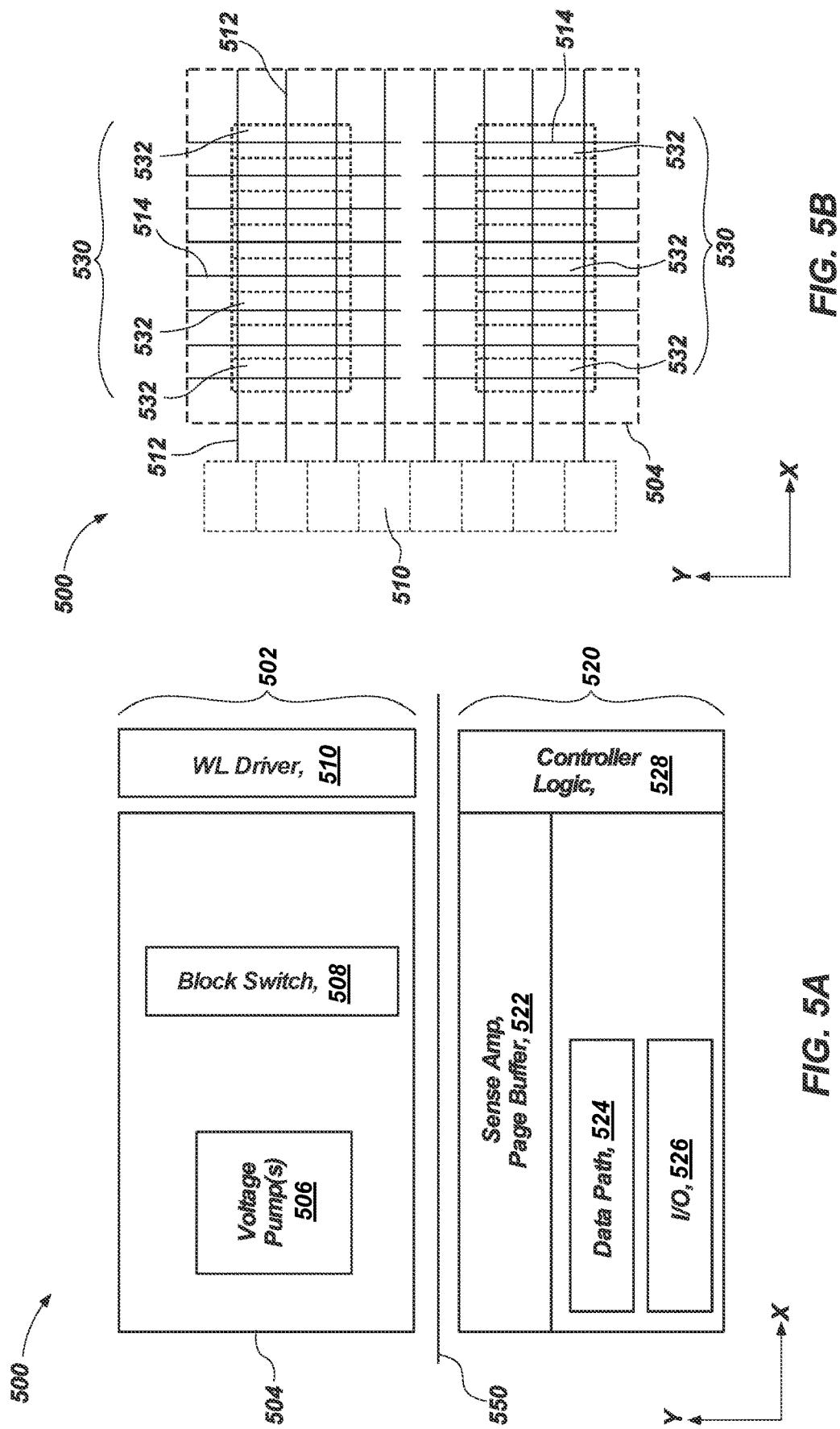
FIG. 5A and FIG. 5B are simplified schematics illustrating a circuit footprint of a microelectronic device including a first microelectronic device structure and a second microelectronic device structure, in accordance with additional embodiments of the disclosure.

FIG. 5A is a simplified schematic illustrating a circuit footprint of a microelectronic device 500, in accordance with embodiments of the disclosure. The microelectronic device structure may include one of the microelectronic device structure assemblies 170, 270, 370 or the relatively larger microelectronic device structure assemblies 190, 390 described above with reference to FIG. 1A through FIG. 3B.

The circuit footprint of the microelectronic device structure of FIG. 5A may be substantially similar to the circuit footprint of FIG. 4A, except that the word line driver 410 and the controller logic 428 may be located outside a periphery of an array boundary 504 that defines a periphery of a memory array region (e.g., the memory array region 104 (FIG. 1A)). Stated another way, the array boundary 504 may define locations (e.g., an area) in which memory cells (e.g., memory cells 134 (FIG. 1A)) are located, such as strings of memory cells of cell pillar structures (e.g., cell pillar structures 132 (FIG. 1A)).

The microelectronic device may include a first microelectronic device structure 502 that may be substantially similar to the first microelectronic device structure 100 described above with reference to FIG. 1A and at least a second microelectronic device structure 520 that may be substantially similar to the second microelectronic device structure 150 described above with reference to FIG. 1B. Although the first microelectronic device structure 502 and the second microelectronic device structure 520 are illustrated as being located in the same X-Y plane in FIG. 5A, it will be understood that the first microelectronic device structure 502 is vertically offset (e.g., in the Z-direction) from the second microelectronic device structure 520. Line 550 of FIG. 5A is to indicate that the first microelectronic device structure 502 is vertically offset from the second microelectronic device structure 520. Accordingly, in some embodiments, the first microelectronic device structure 502 may not be horizontally offset (e.g., in one or both of the X-direction and the Y-direction) from the second microelectronic device structure 520.

Each of the first microelectronic device structure 502 and the second microelectronic device structure 520 may individually comprise a die and may be coupled to each other as described above with reference to FIG. 1A through FIG. 3C. As indicated in FIG. 5A, the first microelectronic device structure 502 die and the second microelectronic device structure 520 die may have the same size (e.g., area).

An array boundary 504 of the first microelectronic device structure 502 may define a periphery of a memory array region (e.g., the memory array region 104 (FIG. 1A)). Accordingly, the array boundary 504 may define locations (e.g., an area) in which memory cells (e.g., memory cells 134 (FIG. 1A)) are located, such as strings of memory cells of cell pillar structures (e.g., cell pillar structures 132 (FIG. 1A)).

The first microelectronic device structure 502 may include various logic devices and associated circuitry. At least some of the logic devices of the first microelectronic device structure 502 may be located within the array boundary 504 and at least other devices of the first microelectronic device structure 502 may be located outside of the array boundary 504. By way of non-limiting example, the first microelectronic device structure 502 may include voltage pumps 506 (e.g., $V_{CCP}$ charge pumps, $V_{NEGWL}$ charge pumps, DVC2 charge pumps), block switches 508 that may be located within the array boundary 504 and may include drivers 510 (e.g., word line (WL) drivers) located outside of the array boundary 504. In some embodiments, the logic devices and associated circuitry of the first microelectronic device structure 502 vertically neighbor the memory array. For example, the logic devices may be located under the memory array.

With continued reference to FIG. 5A, the second microelectronic device structure 520 may include additional logic devices and circuitry for controlling various operations of the first microelectronic device structure 502 (e.g., various operations of the memory array). The devices and circuitry of the second microelectronic device structure 520 may be selected based on (e.g., relative to) the devices and circuitry of the first microelectronic device structure 502. The devices and circuitry of the second microelectronic device structure 520 may be different than the devices and circuitry of the first microelectronic device structure 502.

By way of non-limiting example, the second microelectronic device structure 520 may include sense amplifier(s) and page buffer(s) 522, data path 524, I/O devices 526, and controller logic 528. In some embodiments, the area occupied by the devices of the second microelectronic device structure 520 (e.g., the sense amplifier(s) and page buffer(s) 522, the data path 524, the I/O devices 526, and the controller logic 528) may be substantially the same as the area occupied by devices and circuitry of the first microelectronic device structure 502. In some embodiments, some of the devices of the second microelectronic device structure 520 (e.g., the sense amplifier(s) and page buffer(s) 522, the data path 524, and the I/O devices 526) may be located within the array boundary 504 and other devices of the second microelectronic device structure 520 (e.g., the controller logic 528) may be located outside of the array boundary 504. In some embodiments, the drivers 510 may be located directly vertically neighboring (e.g., directly above, directly below) the controller logic 528.

In some embodiments, the second microelectronic device structure 520 die may be stacked to vertically neighbor the first microelectronic device structure 502 and may not occupy additional area relative to the first microelectronic device structure 502.

Forming the first microelectronic device structure 502 to include some of the logic devices thereof within the array boundary 504 and other of the logic devices (e.g., the drivers 510) outside of the array boundary 504 may facilitate a reduction in the size (e.g., footprint, area) of the first microelectronic device structure 502 while facilitating an increased area for some components of the first microelectronic device structure 502 and the second microelectronic device structure 520 outside of the array boundary 504.

FIG. 5B is a simplified schematic illustrating a layout of the microelectronic device 500 of FIG. 5A. The components and circuitry of the microelectronic device are located within the array boundary 504. The array may include, for example, word lines 512 extending in a first direction (e.g., in the X-direction) and digit lines 514 (e.g., bit lines) extending in a second direction (e.g., the Y-direction) that may be substantially perpendicular to the first direction. The word lines 512 may be coupled to a driver 510 (e.g., word line driver) including word line circuits (e.g., one word line circuit for each word line 512). In some embodiments, the first microelectronic device structure 502 includes only one driver 510.

The first microelectronic device structure 502 may further include one or more banks 530 of page buffers 532. In some embodiments, each bit line 514 is coupled to one page buffer 532. The banks 530 of page buffers 532 may be vertically offset from the driver 510. The banks 530 of page buffers 532 may also be laterally offset (e.g., in one or both of the X-direction and the Y-direction) from the driver 510. Stated another way, the banks 530 of page buffers 532 may not directly vertically neighbor the driver 510.

Forming the driver 510 outside of the array boundary 504 may facilitate an increase in the area within the array boundary 504 for the banks 530 of page buffers 532. In some such embodiments, the microelectronic device 500 may include a greater number of page buffers 532 compared to the microelectronic device 400 described above with reference to FIG. 4A and FIG. 4B.

Thus, in accordance with some embodiments of the disclosure, a microelectronic device comprises a first die comprising a memory array region comprising a stack structure comprising vertically alternating conductive structures and insulative structures, and vertically extending strings of memory cells within the stack structure. The first die further comprises first control logic region comprising a first control logic devices including at least a word line driver. The microelectronic device further comprise a second die attached to the first die, the second die comprising a second control logic region comprising second control logic devices including at least one page buffer device configured to effectuate a portion of control operations of the vertically extending string of memory cells.

Furthermore, in accordance with additional embodiments of the disclosure, a method of forming a microelectronic device comprises forming a first microelectronic device structure comprising a first control logic region comprising first control logic devices including at least one word line driver, and a memory array region vertically neighboring the first control logic region. The first microelectronic device structure further comprises a stack structure comprising vertically alternating conductive structures and insulative structures, and vertically extending strings of memory cells extending through the stack structure. The method further comprises forming a second microelectronic device structure comprising a second control logic region comprising second control logic devices including at least one page buffer, and attaching the first microelectronic device structure to the second microelectronic device structure.

Thus, in accordance with yet other embodiments of the disclosure a microelectronic device comprises a memory array region comprising a stack structure comprising a vertically alternating sequence of conductive structures and insulative structures, and vertically extending strings of memory cells within the stack structure. The microelectronic device further comprises a first control logic region comprising at least one word line driver overlying the memory array region, and a second control logic region comprising at least one page buffer underlying the memory array region, the at least one page buffer configured to operate at lower voltages than the at least one word line driver.

Thus, in accordance with further embodiments of the disclosure, a method of forming a microelectronic device comprises forming a first microelectronic device structure comprising a first semiconductive base structure, a first control logic region comprising high voltage CMOS circuitry comprising at least one word line driver overlying the first semiconductive base structure, and a memory array region overlying the first base semiconductive base structure. The first microelectronic device structure further comprises a stack structure comprising vertically alternating conductive structures and insulative structures, and vertically extending strings of memory cells within the stack structure. The method further comprises forming a second microelectronic device structure comprising a second semiconductive base structure, and a second control logic region overlying the second semiconductive base structure and comprising low voltage CMOS circuitry comprising at least one page buffer. The method further comprises attaching the first microelectronic device structure to the second microelectronic device structure.

Figure 6:
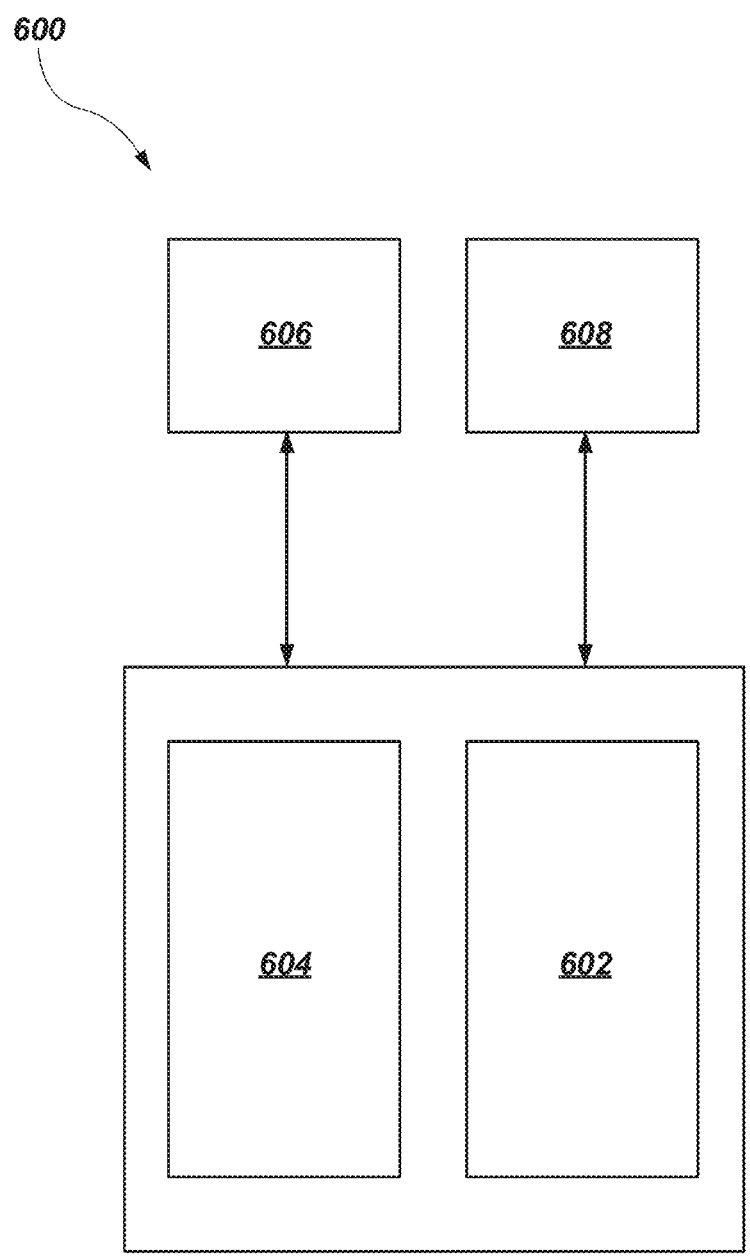
FIG. 6 is a schematic block diagram of an electronic system, in accordance with an embodiment of the disclosure.

Structures, assemblies, and devices in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 5B. The electronic system 600 may further include at least one electronic signal processor device 604 (often referred to as a "microprocessor"). The electronic signal processor device 604 may, optionally, include an embodiment of one or more of a microelectronic device structure, a microelectronic device structure assembly, a relatively larger microelectronic device structure assembly, and a microelectronic device previously described herein with reference to FIG. 1A through FIG. 5B. While the memory device 602 and the electronic signal processor device 604 are depicted as two (2) separate devices in FIG. 6, in additional embodiments, a single (e.g., only one) memory/processor device having the functionalities of the memory device 602 and the electronic signal processor device 604 is included in the electronic system 600. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 5B. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, one or more of a monitor, a display, a printer, an audio output jack, and a speaker. In some embodiments, the input device 606 and the output device 608 may comprise a single touchscreen device that can be used both to input information to the electronic system 600 and to output visual information to a user. The input device 606 and the output device 608 may communicate electrically with one or more of the memory device 602 and the electronic signal processor device 604.

Thus, in accordance with embodiments of the disclosure, an electronic system comprises an input device, an output device, a processor device operably coupled to the input device and the output device, and a memory device operably coupled to the processor device. The memory device comprises a stack structure comprising tiers each comprising a conductive structure and an insulative structure vertically neighboring the conductive structure, vertically extending strings of memory cells within the stack structure, a first control logic region comprising CMOS circuitry vertically overlying the stack structure and comprising at least one word line driver, and a second control logic region comprising additional CMOS circuitry vertically underlying the stack structure and comprising page buffers, the page buffers having relatively lower operational voltage requirements than the at least one word line driver.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a first die comprising:
      a memory array region comprising:
         a stack structure comprising vertically alternating conductive structures and insulative structures; and
         vertically extending strings of memory cells within the stack structure;
      a first control logic region comprising first control logic devices including at least a word line driver; and
   a second die attached to the first die, the second die comprising a second control logic region comprising second control logic devices including at least one page buffer device configured to effectuate a portion of control operations of the vertically extending strings of memory cells, the at least one page buffer device extending a length of the second die.

2. The microelectronic device of claim 1, further comprising a back end of line (BEOL) structure on a side of a semiconductive base structure of the first die opposite the first control logic region.

3. The microelectronic device of claim 1, further comprising a back end of line (BEOL) structure on a side of a base semiconductive structure of the second die opposite second control logic devices.

4. The microelectronic device of claim 1, wherein a horizontal area of the first die is substantially the same as a horizontal area of the second die.

5. The microelectronic device of claim 1, wherein the first control logic region of the first die is confined within horizontal boundaries of the memory array region of the first die.

6. The microelectronic device of claim 1, further comprising a third die coupled to the second die, the third die comprising a third control logic region comprising substantially the same types of control logic devices as the second control logic region.

7. The microelectronic device of claim 1, wherein the first control logic devices further comprise a voltage pump and a block switch.

8. The microelectronic device of claim 1, wherein the second control logic devices further comprise at least one I/O device, at least one sense amplifier, and a data path.

9. The microelectronic device of claim 1, wherein an operating voltage of the second control logic devices are lower than operating voltages of the first control logic devices.

10. A method of forming a microelectronic device, the method comprising:
    forming a first die, comprising:
       a first control logic region comprising first control logic devices including at least one word line driver; and
       a memory array region vertically neighboring the first control logic region, the memory array region comprising:
          a stack structure comprising vertically alternating conductive structures and insulative structures; and
          vertically extending strings of memory cells within the stack structure;
    forming a second die comprising a second control logic region comprising second control logic devices including at least one page buffer configured to effectuate a portion of control operations of the vertically extending strings of memory cells, the at least one page buffer extending a length of the second die; and
    attaching the first die to the second die.

11. The method of claim 10, wherein attaching the first die to the second die comprises positioning the memory array region between the first control logic region and the second control logic region.

12. The method of claim 10, further comprising forming the first control logic region to comprise at least one voltage pump and at least one block switch.

13. The method of claim 10, wherein forming the first control logic region to comprise at least one voltage pump and at least one block switch comprises:
    forming the at least one voltage pump and the at least one block switch within horizontal array boundaries of the first die; and
    forming the at least one word line driver outside of the horizontal array boundaries of the first die.

14. The method of claim 10, wherein forming a second die comprising a second control logic region including at least one page buffer comprises forming one page buffer for every bit line of the memory array region.

15. The method of claim 10, wherein forming a second die comprising a second control logic region comprises forming the second control logic region to comprise second control logic devices configured to operate at relatively lower voltages than first control logic devices of the first die.

16. The method of claim 10, further comprising, after attaching the first die to the second die, forming a back end of line (BEOL) structure vertically neighboring one of the first die or the second die.

17. The method of claim 10, further comprising, attaching a third die to the second die, the third die comprising at least one additional page buffer.

18. The method of claim 10, wherein forming a second die comprises forming the second die to have substantially the same horizontal area as the first die.

19. A microelectronic device, comprising:
   a memory array region comprising:
      a stack structure comprising a vertically alternating sequence of conductive structures and insulative structures; and
      vertically extending strings of memory cells within the stack structure;
   a first control logic overlying the memory array region and comprising:
      a first portion comprising at least one word line driver located outside of an area defined by the memory array region; and
      a second portion comprising additional control logic devices located within the area defined by the memory array region; and
   a second control logic region comprising at least one page buffer underlying the memory array region, the at least one page buffer configured to operate at lower voltages than the at least one word line driver.

20. The microelectronic device of claim 19, further comprising a third control logic region underlying the second control logic region, the third control logic region comprising substantially the same control devices as the second control logic region.

21. The microelectronic device of claim 19, wherein the additional control logic devices located within the area defined by the memory array region comprise at least one voltage pump.

22. The microelectronic device of claim 19, wherein the second control logic region comprises one or more sense amplifiers, one or more I/O devices, and controller logic.

23. The microelectronic device of claim 19, wherein the additional control logic devices comprise at least one block switch and at least one voltage pump.

24. The microelectronic device of claim 19, wherein the second control logic region comprises CMOS circuitry configured to operate at applied voltages within a range of from about 0.7 V to about 1.4 V.

25. A method of forming a microelectronic device, the method comprising:
   forming a first microelectronic device structure comprising:
      a first semiconductive base structure;
      a memory array region overlying the first semiconductive base structure and comprising:
         a stack structure comprising vertically alternating conductive structures and insulative structures; and
         vertically extending strings of memory cells within the stack structure; and
      a first control logic region comprising high voltage CMOS circuitry comprising:
         a first portion comprising at least one word line driver located outside of an area defined by the memory array region; and
         a second portion comprising additional control logic devices located within the area defined by the memory array region;
   forming a second microelectronic device structure comprising:
      a second semiconductive base structure; and
      a second control logic region overlying the second semiconductive base structure and comprising low voltage CMOS circuitry comprising at least one page buffer configured to operate at lower voltages than the at least one word line driver; and
   attaching the first microelectronic device structure to the second microelectronic device structure such that the at least one page buffer underlies the memory array region.

26. The method of claim 25, further comprising:
   thinning the second semiconductive base structure to expose at least one conductively filled via extending through the second semiconductive base structure; and
   forming a back end of line (BEOL) structure in electrical communication with the at least one conductively filled via.

27. The method of claim 25, further comprising coupling bond pad structures of the second microelectronic device structure to bond pads of a third microelectronic device structure comprising at least an additional page buffer.

28. The method of claim 25, wherein forming a second microelectronic device structure comprises forming a second microelectronic device structure comprising a second control logic region comprising data path, at least one I/O device, and controller logic.

29. An electronic system, comprising:
   an input device;
   an output device;
   a processor device operably coupled to the input device and the output device; and
   a memory device operably coupled to the processor device and comprising:
      a memory array region comprising:
         a stack structure comprising tiers each comprising a conductive structure and an insulative structure vertically neighboring the conductive structure; and
         vertically extending strings of memory cells within the stack structure;
      a first control logic region comprising CMOS circuitry vertically overlying the memory array region and comprising:
         a first portion comprising at least one word line driver located outside of an area defined by the memory array region; and
         a second portion comprising additional control logic devices located within the area defined by the memory array region; and
      a second control logic region comprising additional CMOS circuitry vertically underlying the stack structure and comprising page buffers configured to operate at lower voltages than the at least one word line driver.

* * * * *